United States Patent
Kurata et al.

(10) Patent No.: US 7,283,400 B2
(45) Date of Patent: *Oct. 16, 2007

(54) NONVOLATILE SEMICONDUCTOR STORAGE DEVICE

(75) Inventors: Hideaki Kurata, Kokubunji (JP); Naoki Kobayashi, Tokyo (JP); Shunichi Saeki, Ome (JP); Takashi Kobayashi, Tokorozawa (JP); Takayuki Kawahara, Higashiyamato (JP); Yoshinori Takase, Tokyo (JP); Keiichi Yoshida, Musashimurayama (JP); Michitaro Kanamitsu, Ome (JP); Shoji Kubono, Ome (JP); Atsushi Nozoe, Hino (JP)

(73) Assignees: Renesas Technology Corp., Tokyo (JP); Hitachi Device Engineering Co., Ltd., Mobara-Shi (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/228,389

(22) Filed: Sep. 19, 2005

(65) Prior Publication Data

US 2006/0013032 A1    Jan. 19, 2006

Related U.S. Application Data

(63) Continuation of application No. 10/250,922, filed as application No. PCT/JP02/00142 on Jan. 11, 2002, now Pat. No. 6,950,347.

(30) Foreign Application Priority Data

Jan. 22, 2001   (WO) .............. PCT/JP01/00133

(51) Int. Cl.
*G11C 16/04* (2006.01)
(52) U.S. Cl. .................. 365/185.29; 365/185.18; 365/185.28
(58) Field of Classification Search .......... 365/185.29, 365/185.18, 185.28
See application file for complete search history.

(56) References Cited

U.S. PATENT DOCUMENTS

| | | | | |
|---|---|---|---|---|
| 4,486,859 A | * | 12/1984 | Hoffman ............... | 365/185.08 |
| 5,602,779 A | * | 2/1997 | Gotou .................. | 365/185.23 |
| 5,818,753 A | * | 10/1998 | Gotou .................. | 365/185.29 |
| 6,097,634 A | * | 8/2000 | Sugiyama ............. | 365/185.21 |
| 6,331,953 B1 | * | 12/2001 | Wang et al. .......... | 365/185.29 |

* cited by examiner

*Primary Examiner*—Huan Hoang
(74) *Attorney, Agent, or Firm*—Antonelli, Terry, Stout & Kraus, LLP.

(57) ABSTRACT

A nonvolatile memory device of the present invention performs a programming operation by accumulating a charge in certain capacitance which is provided for each programming memory cell and injecting hot electrons generated when the charge is discharged via the memory cell into a floating gate. Thus, a variation in a programming characteristic of the nonvolatile semiconductor memory device is reduced, thereby realizing high-speed programming operation.

14 Claims, 35 Drawing Sheets

(a) PROGRAM OPERATION VOLTAGE (b) TIMING 1

(c) TIMING 2

NONVOLATILE SEMICONDUCTOR STORAGE DEVICE

CROSS-REFERENCE TO RELATED APPLICATIONS

This is a Continuation of application Ser. No. 10/250,922, filed Jul. 8, 2003 now U.S. Pat. No. 6,950,347, the entire disclosure of which is hereby incorporated by reference and wherein application Ser. No. 10/250,922 is a national stage application filed under 35 USC §371 of International Application No. PCT/JP02/00142, filed 11 Jan. 2002, the contents of Application No. PCT/JP02/00142 are incorporated herein by reference in their entirety.

TECHNICAL FIELD

The present invention relates to a nonvolatile semiconductor memory device and, particularly, to a nonvolatile semiconductor memory device such as an electrical programmable and erasable flash memory.

BACKGROUND ART

Among electrical programmable and erasable nonvolatile semiconductor memory devices, flash memories are known in the art as the one capable of bulk erasing. Since the flash memories are excellent in portability as well as impact resistance and capable of electrical bulk erasing, they are rapidly growing in demand in recent years as memory devices to be used for personal digital assistances such as a mobile personal computer and a digital still camera. One of the important factors in expanding the market for the flash memories is a reduction in bit cost by way of a reduction in memory cell area. For example, as is mentioned in "Applied Physics", Vol. 65, No. 11, pp. 1114–1124, published by The Japan Society of Applied Physics on Jan. 10, 1996, various memory cell technologies which realize the reduction in bit cost have heretofore been proposed.

DISCLOSURE OF INVENTION

A virtual ground type memory cell using a three-layer polysilicon gate, which is originated with the present inventors, has been proposed as another memory cell technology (Japanese Patent Laid-open No. 11-200242).

The above-mentioned memory cell is shown in FIG. 1, wherein (a) is a plane view and (b), (c), and (d) are cross-sectional views taken along lines A–A', B–B', and C–C', respectively.

The memory cell has a source-drain diffusion layer 205 formed in a well 101 formed on the main surface of a semiconductor substrate 100, a first gate (floating gate) 103*b*, a second gate (control gate) 111*a*, and a third gate 107*a*. The control gates (second gates) 111*a* of the memory cells are connected to each other along the row direction (x direction) to form a word line WL.

The floating gate (first gate) 103*b* is isolated from the well 101, the third gate 107*a*, and the word line (control gates) 111*a* by a gate insulator film (first insulator film) 102, an insulator film (third insulator film) 106*a*, and an insulator film (second insulator film) 110*a*, respectively. In addition, the third gate 107*a* is isolated from the word line 111*a* by an insulator film 108*a*.

The source/drain diffusion layers 205 extend along a direction (y direction) perpendicular to a direction (x direction) along which the word line 111*a* extends, thereby serving as a local source line and a local data line for connecting sources/drains of the memory cells aligned along the column direction (y direction). In other words, this nonvolatile semiconductor memory device is formed of the so-called contactless array wherein a contact hole is not formed for each memory cell. A channel is formed along a direction (x direction) perpendicular to the diffusion layers 105. The source/drain diffusion layers 205 are arranged in such a manner that a pair of diffusion layers 205 forming a source/drain is positioned asymmetrically with a floating gate pattern 103*a*, so that one diffusion layer overlaps with both the floating gate and the third gate.

Two end faces of the third gate 107*a* respectively face two end faces of the floating gate 103*b* with the insulator film 106*a* being interposed therebetween, the end faces of the floating gate 103*b* being respectively perpendicular to the word line 111*a* and the channel.

Further, the third gates 107*a* are respectively buried in gaps between the floating gates 103*b* which are disposed along a direction (y direction) perpendicular to the word line 111*a* and the channel. The floating gates 103*b* are arranged asymmetrically with the third gates 107*a*, and the third gates 107*a* are arranged asymmetrically with the floating gates 103*b*.

With this configuration, even if the third gates 107*a* are provided in addition to the floating gates 103*a* and the control gates 111*a*, it is possible to double pitches in the word line WL direction (x direction) and the local data line direction (y direction) as compared with those of the minimum feature size. Therefore, it is possible to reduce the memory cell area to the minimum size of $4F^2$ (F: minimum feature size) in a cross point type array.

The above-described memory cell enables not only the reduction in size but also high-speed programming. A voltage application condition at the time of programming to a memory cell is shown in FIG. 2(*a*), and operation schemes are separately shown in FIGS. 2(*b*) and 2(*c*). Refereeing to FIG. 2(*b*), a positive voltage of about 5 V, for example, is applied to a diffusion layer Dn, which is a drain of a selected memory cell M, at a timing of time t0, then a positive voltage of about 12 V, for example, is applied to a word line WLn of the selected memory cell M at a timing of time t1, and, after that, a voltage which is approximately equal to a threshold voltage of a MOS transistor formed of a third gate, such as 0.6 V, is applied to a third gate AGe of the selected memory cell M at a timing of time t2. A diffusion layer Dn−1 which is a source of the selected memory cell, a well, and an unselected word line WLn+1 are maintained at 0 V. With the above operation, a large electric field is formed both laterally and vertically in a channel below a boundary between the floating gate and the third gate. Thus, in spite of the smaller channel current, efficiency in generating and injecting hot electrons are increased, thereby enabling the high-speed programming. Consequently, it is possible to achieve parallel programming of memory cells of more than a kilobyte using an internal power source having a current supply capacity of about 1 mA. It is possible to perform the above operation if the voltage application timings of the word line WLn, the diffusion layer Dn, and the third gate AGe of the selected memory cell are exchanged as shown in FIG. 2(*c*).

However, some problems will arise in the above-described memory cell programming method. Since the voltage which is approximately equal to the threshold voltage of the MOS transistor formed of the third gate is applied to the third gates AG for the operation in the above programming method, a dimensional variation and a variation in applied voltages of the third gates AG significantly influence a programming characteristic of the memory cell. Shown in FIG. 3 is a relationship among a voltage to be applied to the third gate, a channel current, and a gate current. As shown in FIG. 3, the gate current Ig changes exponentially near the voltage of about 0.6 V of the third gate AG during the operation. For example, if there is a variation of ±0.1 V in the voltages of the third gate AG, the variation in the gate currents Ig will be about the order of 1.3.

Further, since the internal power source for supplying the channel current operates at the time of programming, the third gate AG voltage may possibly be changed due to noise from the internal power source. As described above, since the memory cell programming characteristic is influenced by the third gate AG voltage to a considerable degree, even smallest driving noise from the internal power source can cause a variation in the characteristic.

The programming operation is executed in such a manner that an application of programming bias and a verification of the threshold voltage are repeated until each of the threshold voltages of the memory cells for simultaneous programming reaches a desired value. Therefore, if the variation in memory cell characteristic occurs, the numbers of repeating the programming bias application and the threshold voltage verification are increased to lengthen a programming period. Accordingly, it is expected that the memory cell programming period will be increased due to variations in the dimensions of the third gates AG, the variation in voltages applied to the third gates AG, and the influence of driving noise from the internal power source.

Further, in order to realize a multi-level storage which is capable of storing data of 2 or more bits per memory cell, it is necessary to reduce a width of threshold voltage distribution for each data; therefore, the variation in programming characteristic will largely increase the memory cell programming period.

The present invention provides a nonvolatile semiconductor memory device which is suitable for size reduction and capable of absorbing a variation in programming characteristics of high-speed operation memory cells and realizing a fast programming speed.

The above object is attained by the following means. FIG. 3 shows that the gate current Ig is greatly influenced by the AG bias; however, injection efficiency γ is less subject to the AG bias as compared with the gate current. For example, if there is an AG variation of ±0.1 V near an AG voltage of about 0.6 V during the operation, a variation in the injection efficiency is in the order of about 0.3. Accordingly, it is possible to suppress the variation in programming characteristic to a level similar to that in the injection efficiency by accumulating charges at certain capacitance and performing the programming by supplying the charges accumulated in the certain capacitance to a memory cell. Likewise, it is possible to suppress the variation in programming characteristic to a level similar to that in the injection efficiency by performing the programming by accumulating charges in certain capacitance via the memory cell.

Some points of the present invention are listed up below.

Programming or erasing is performed by discharging or charging a charge from or to capacitance via a memory cell and injecting hot electrons to a charge-injected portion. Thus, the high-speed memory cell programming operation or high-speed memory cell erase operation is achieved.

By using stray capacitance of a bit line including pn junction capacitance of a diffusion layer as the capacitance, the above high-speed operations are achieved without specially changing the structure of a nonvolatile semiconductor memory device.

A variation in characteristic due to operation noise caused by an internal power source can be suppressed by maintaining an internal power source circuit for generating a voltage to be applied to the bit line in an inactive state when injecting the charges into the charge-injected portion.

The high-speed operations are more effectively achieved by performing the threshold voltage verification operation of the memory cell after repeating the programming operation or the erase operation a plurality of times and increasing the number of repeating the programming operation or the erase operation every time the threshold voltage verification operation is performed.

BEST MODE FOR CARRYING OUT THE INVENTION

Embodiments of the present invention will hereinafter be described in detail with reference to the drawings.

<Embodiment 1>

Figure 2:
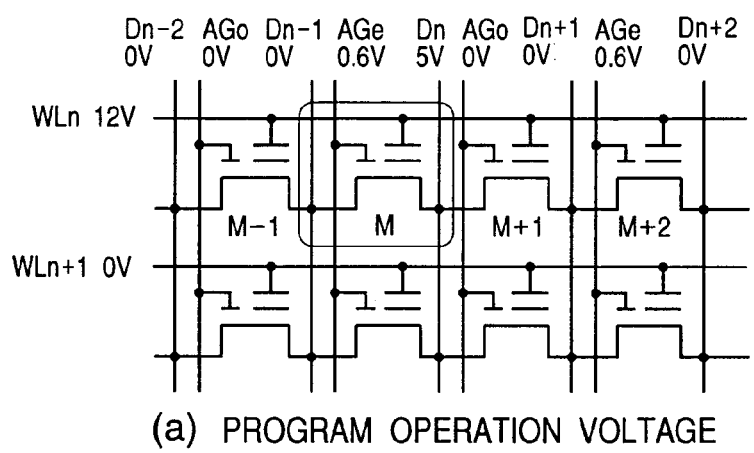
FIG. 2 includes diagrams illustrating the programming operation of the flash memory.
Figure 2:
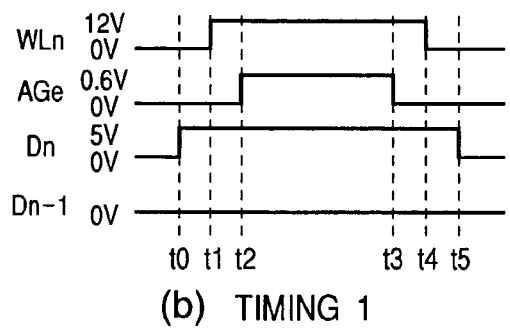
Figure 2:
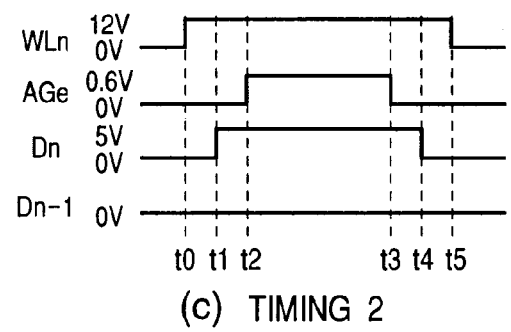
Figure 3:
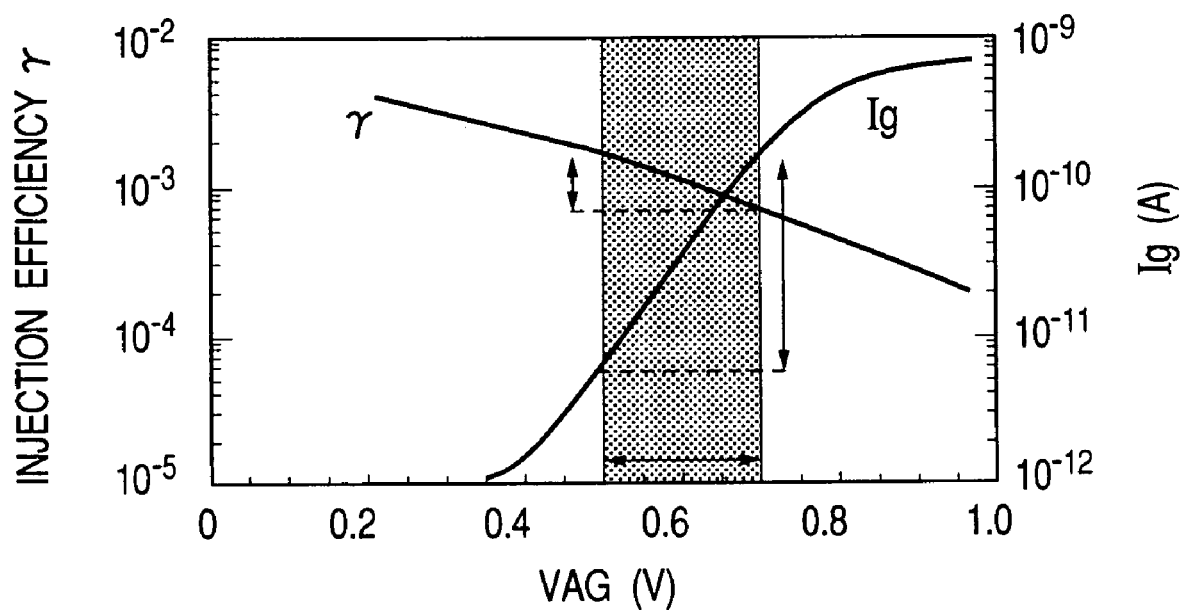
FIG. 3 is a diagram illustrating a problem of the flash memory and a solution to the problem.
Figure 4:
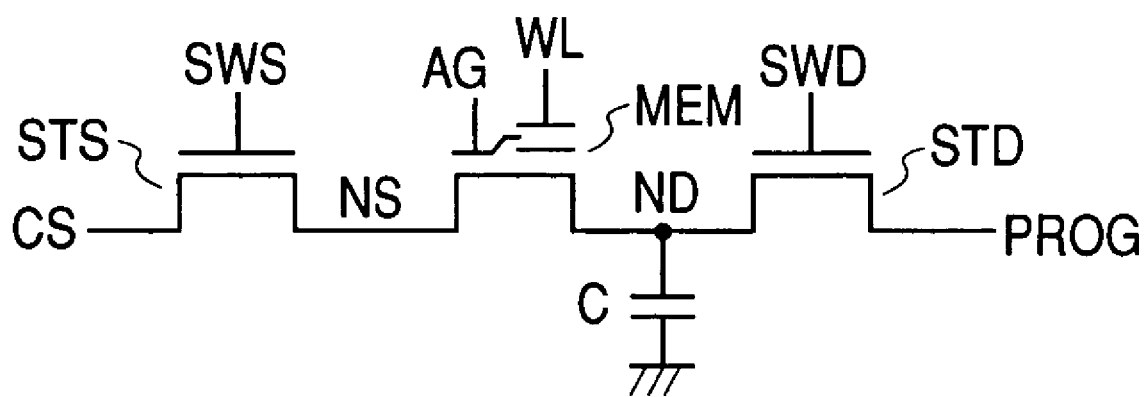
FIG. 4 is a circuit diagram illustrating a first embodiment of the present invention.
Figure 5:
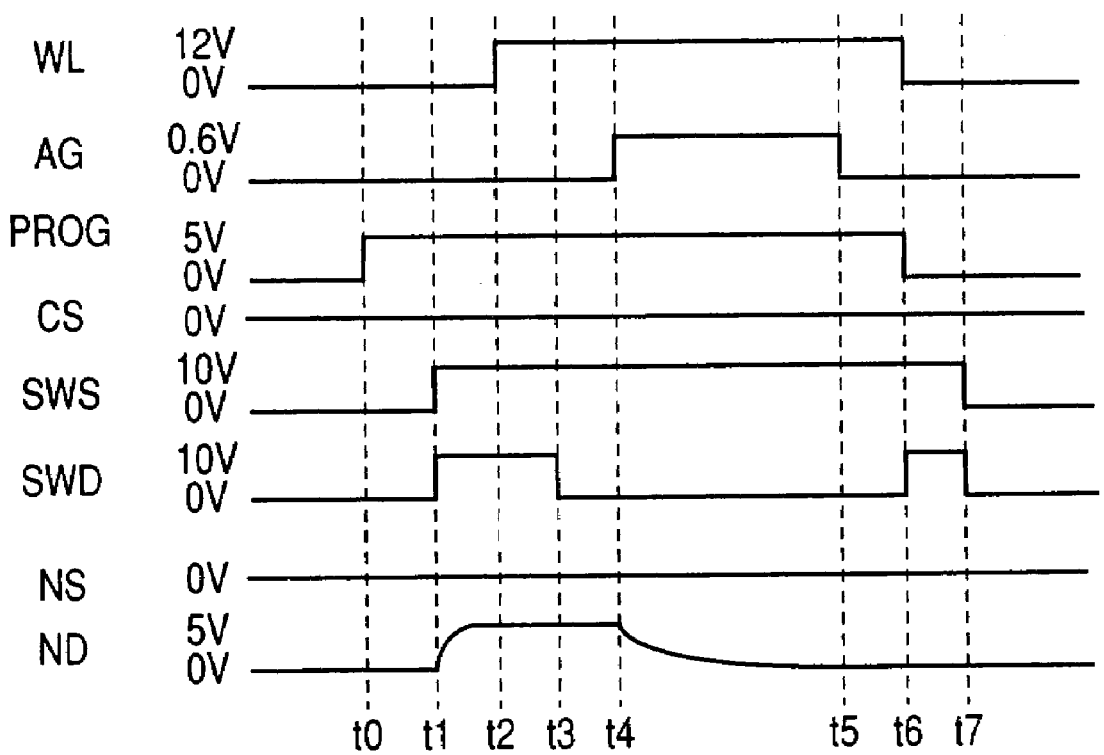
FIG. 5 is a diagram showing timings in the circuit diagram of FIG. 4.

A first embodiment of the present invention will be described with reference to FIGS. 4 to 7. FIG. 4 is a circuit diagram which is directed to one of memory cells of the memory array structure shown in FIG. 2, and FIG. 5 is a diagram showing a programming operation scheme of the present embodiment. As shown in FIG. 5, an internal power source PROG for supplying a channel current is activated to 5 V at a timing of time t0; STS and STD, which are the respective switching MOS on the source side and the drain side of a selected memory cell, are brought to an ON-state at a timing of t1; and a programming voltage of 12 V is biased to a word line WL of the selected memory cell at a timing of time t2. Then, when a node ND on the drain side of the memory cell is charged to 5 V, STD, which is the switching MOS on the drain side, is brought to an OFF-state at a timing of time t3 to be disconnected from the internal power source PROG. When a voltage of about 0.6 V is biased to a third gate AG of the selected memory cell at a timing of time t4, a charge accumulated in the node ND starts to flow toward the source side via the memory cell. Here, hot electrons generated in a channel region of the memory cell are injected into a floating gate to achieve programming. A voltage of the node ND on the drain side is decreased with the flow of a channel current, but the programming is effectively achieved during a period when a horizontal electric field high enough to generate the hot electrons is generated.

Figure 1:
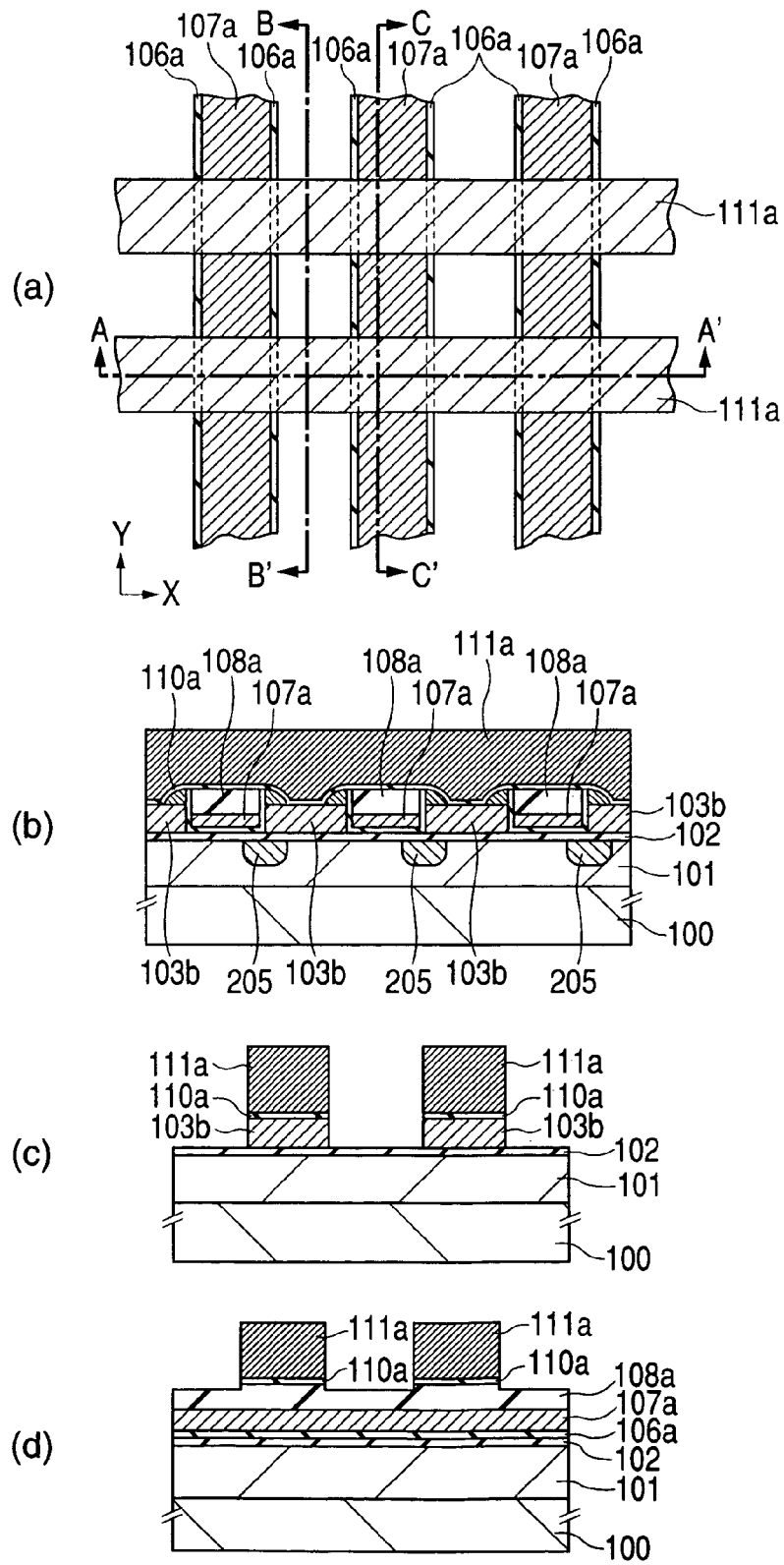
FIG. 1 is a cross-sectional view of a flash memory, illustrating a principle of the present invention.
Figure 6:
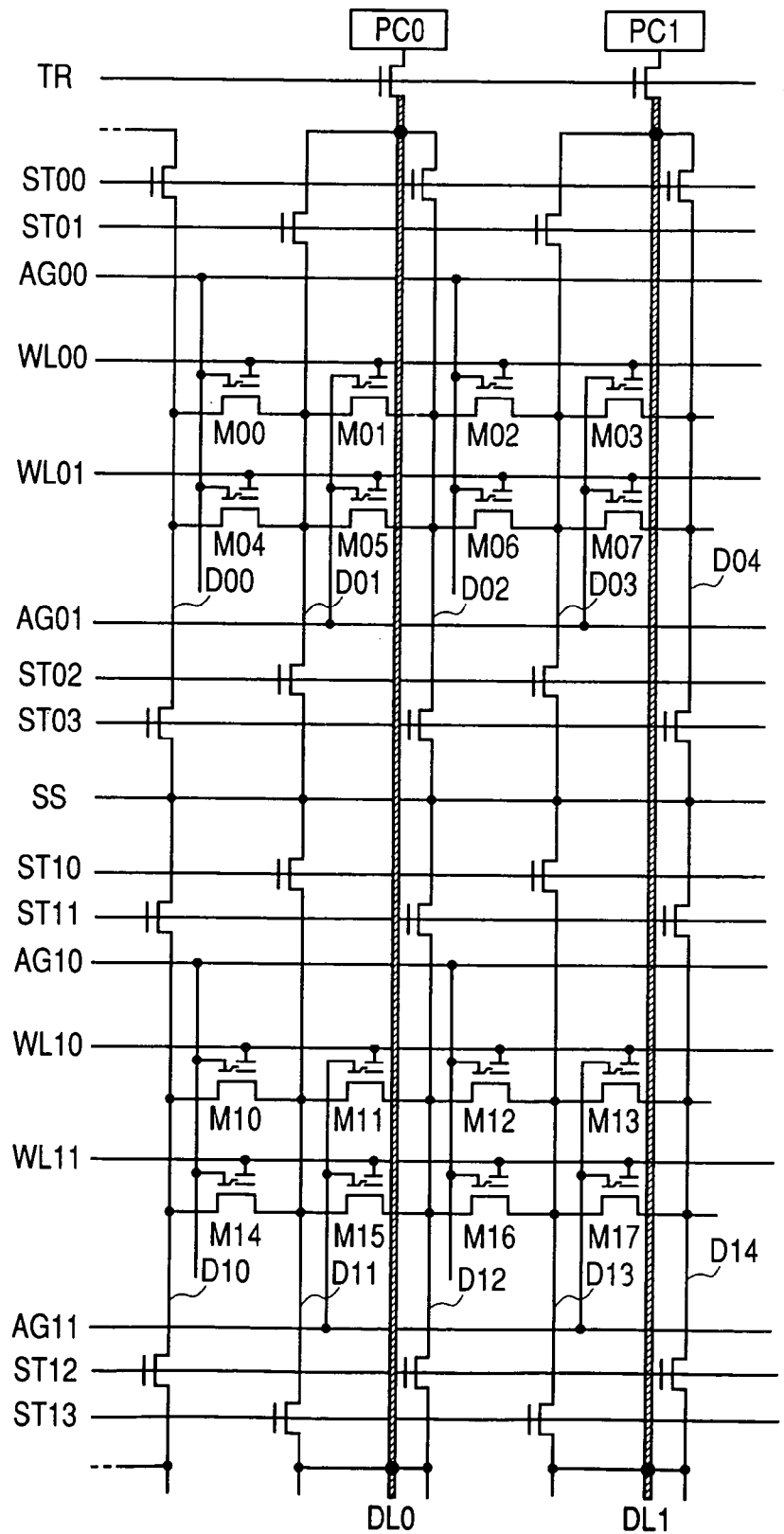
FIG. 6 is a diagram showing a memory array structure for explaining the first embodiment in detail.
Figure 7:
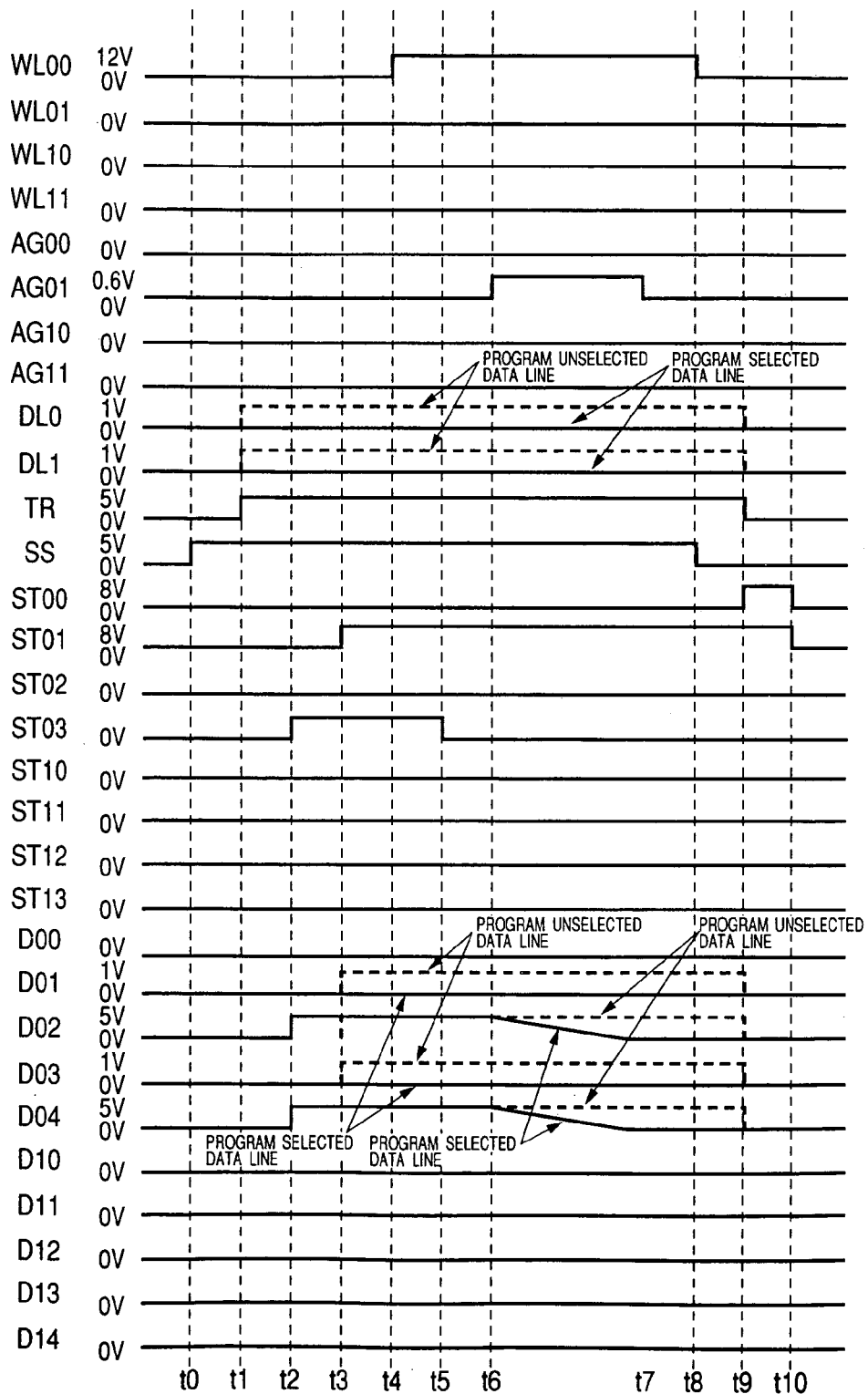
FIG. 7 is a diagram illustrating timings in the programming operation according to the first embodiment.

The present embodiment will be described in more detail with reference to FIGS. 6 and 7. Shown in FIG. 6 is an example of the memory array structure of FIG. 1, and shown in FIG. 7 is a programming operation of the present invention. In FIG. 6, nodes D00 to D03 and D10 to D13, which are sources and drains of memory cells, are formed of diffusion layer wirings, and 128 memory cells, for example, are arranged parallelly on one diffusion layer wiring. The diffusion layer wiring is connected to one another via bit lines DL0 and DL1 formed of metal and a selected transistor. In addition, the selected transistor is controlled by signals sent from ST00, ST01, ST12, and ST13. Further, the diffusion layer wiring is connected to one another via a common source line and a selected transistor, and the selected transistor is controlled by signals sent from ST02, ST03, ST10, and ST11. Used as the common source line SS is diffusion layer wiring or diffusion layer wiring whose wiring resistance is reduced by shunting with metal. Although two lines of diffusion layer wiring are connected to one metal bit line via two selected transistors in FIG. 6, N lines of diffusion layer wiring may be connected to one metal bit line via N selected transistors. Likewise, although two lines of diffusion layer wiring are connected to one common source line via two selected transistors, N lines of diffusion layer wiring may be connected to one common source line via N selected transistors. The metal bit lines DL0 and DL1 are connected to control circuits PC0 and PC1 respectively via the switching MOS.

The operation of the present invention will be described using a timing waveform shown in FIG. 7. Hereinafter, it is assumed that a memory cell to which the programming is performed is a word line WL00. Firstly, after a programming command and programming data are inputted, the common source line SS is activated to about 5 V at a timing t0. Then, TR is activated to connect the bit lines to the control circuits at a timing of time t1. Here, the control circuits output to the bit lines voltages corresponding to the programming data. For example, a voltage of 0 V is applied to the bit line for the program-selected memory cell, and a voltage of 1 V is applied to the bit line for the program-unselected memory cell. After that, the gate signal ST03 of the selected transistor is brought to a High state at a timing of time t2 to charge diffusion layer wiring D02 and D04 to 5 V. Then, the gate signal ST01 of the selected transistor is brought to a High state at a timing of time t3 to connect the bit lines DL0 and DL1 to the diffusion layer wirings D01 and D03, respectively. Here, a voltage of each of the program-selected D01 and D03 is 0 V, while a voltage of each of the program-unselected D01 and D03 of program unselected data line is 1 V. After activating the selected word line WL00 to a programming voltage of 12 V, for example, at a timing of time t4, the gate signal ST03 of the selected transistor is set to LOW at a timing of time t5 to disconnect the diffusion layer wiring D02 and D04 from the common source line. After that, a programming voltage of about 0.6 V, for example, is biased to AG01 which is a selected AG gate. If a memory cell M01 is the program-selected cell, voltages applied to D01, D02, the word line WL00, and the AG gate are 0 V, 5 V, 12 V, and 0.6 V, respectively; therefore, electrons are injected into the floating gate. In this case, since D02 is in a floating state after being charged to 5 V, a voltage thereof is decreased as the channel current flows to the memory cell M01, the voltage being ultimately decreased to 0 V. Therefore, the electron injection into the floating gate occurs as long as the voltage of D02 is the bias sufficient for the hot electron generation. On the other hand, if the memory cell M01 is program-unselected, voltages applied to D01, D02, the word line WL00, and AG01 are 1 V, 5 V, 12 V, and about 0.6 V, respectively; therefore, no channel current flows thereto and no electron injection into the floating gate occurs. The capacitance of one diffusion layer wiring is mainly pn junction capacitance, and, in the array structure of the present invention, the capacitance is about 0.3 pF.

Next, AG01 is inactivated at a timing of time t7, and WL00 and SS are inactivated at a timing of time t8. Then, TR is inactivated at a timing of time t9 to interrupt the connection between the control circuits and the bit lines, so that the bit lines and the diffusion layer wiring are discharged to 0V to complete the operation of injecting electrons into the floating gate.

After that, an operation for verifying whether or not a threshold voltage has reached a desired value is performed, and the electron injection operation is repeated for memory cells in which the desired threshold voltage has not been attained. The programming is terminated when the desired threshold voltage is attained in each of the memory cells to which the programming must be performed.

Thus, since a programming variation due to a variation in AG bias is reduced, thereby reducing the number of programming verification, it is possible to shorten time required for programming.

Further, since it is unnecessary to activate the internal power source for supplying the programming bias of 5 V during the programming, it is possible to suppress the variation in programming characteristic caused by operation noise of the internal power source and to reduce the power consumption by maintaining the internal power source at the inactive state.

In the foregoing, the operation of increasing the threshold voltage is described as the programming; however, it is possible to apply the threshold voltage increasing operation to an erase operation.

Also, in the case of the multilevel memory, wherein a memory cell is capable of having two or more threshold voltages, the effect of the present method becomes more prominent. In the multilevel memory, since it is necessary to control with high precision the threshold voltages for data, if the programming variation is great, the number of threshold voltage verification is increased, thereby reducing the programming speed. In the present method, the programming variation is reduced to suppress the number of threshold voltage verification, thereby increasing the programming speed.

In addition, the same effect is achieved if the memory cell is the one wherein the charge accumulation node of the present embodiment is formed of a silicon nitride film or a multilayer of a silicon nitride film and a silicon oxide film in place of a polysilicon film.

Alternatively, the same effect is achieved if the memory cell is the one wherein the charge accumulation node is formed of a plurality of polysilicon particles in the form of dots in place of the polysilicon film.

Further, in the case of using the silicon nitride film or the dotted polysilicon particles as the charge-injected portion, the same effect is achieved if the memory cell is the one wherein the polysilicon gate having the same function as that of the third gate is provided on each side of the charge-injected portion via a silicon oxide film. In this case, the charge-injected portion can discretely retain charges at two places close to the respective adjacent polysilicon gates, and thus, the multilevel memory is realized by the different charge accumulation places.

<Embodiment 2>

Figure 8:
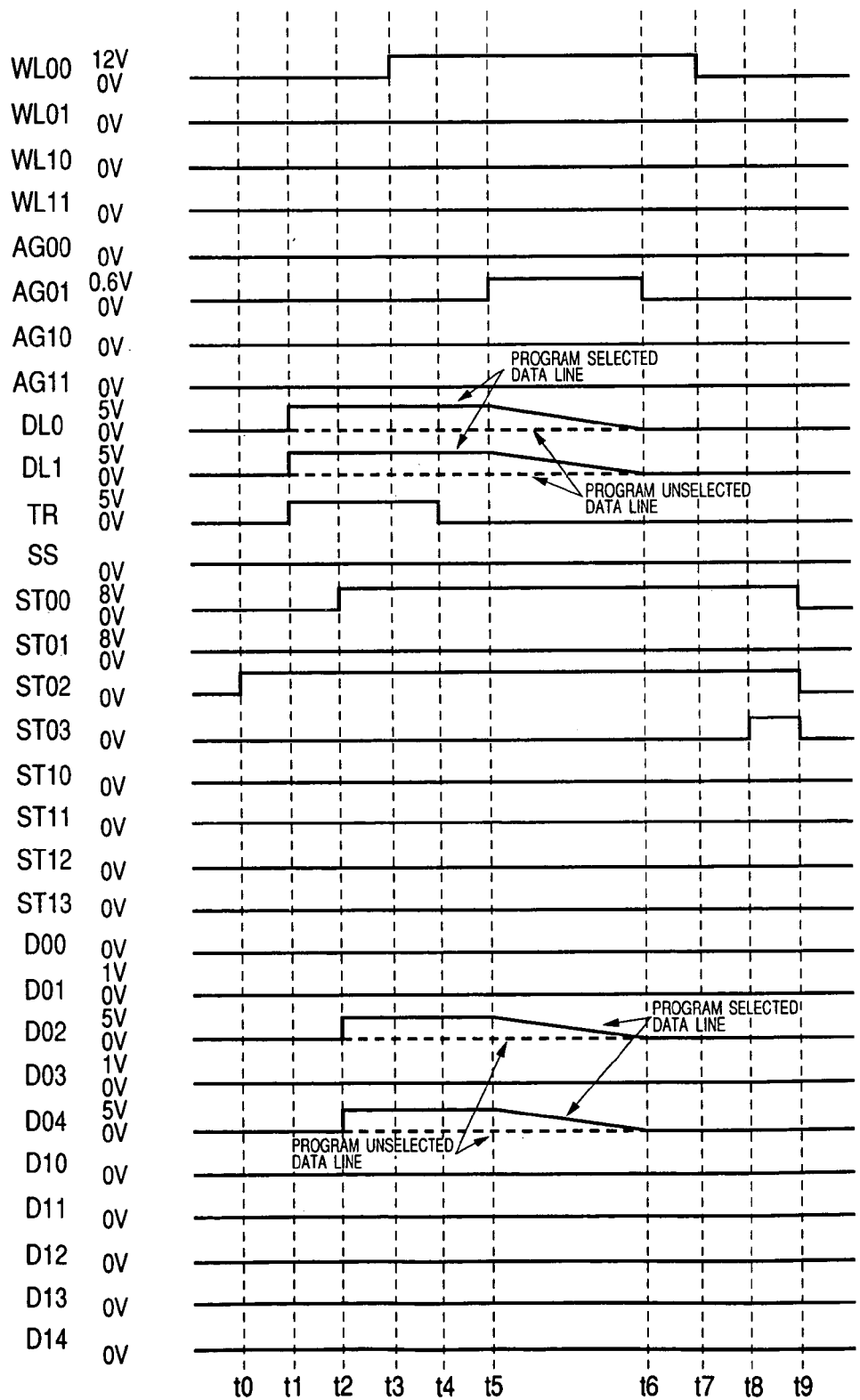
FIG. 8 is a diagram illustrating timings in a programming operation according to a second embodiment.

A second embodiment of the present invention will be described with reference to FIGS. 6 and 8. Shown in FIG. 8 is a programming operation scheme of the present embodiment in an array structure shown in FIG. 6. The array structure of FIG. 6 is the same as that described in Embodiment 1, wherein it is assumed that a memory cell to which programming is performed is a word line WL00.

After a programming command and programming data are inputted, ST02 is activated at a timing of time t0 to connect diffusion layer wiring D01 and D03 to a common source line, respectively. Then, TR is brought to a High state at a timing of time t1 to connect control circuits PC0 and PC1 to metal bit lines DL0 and DL1, respectively. Here, voltages applied from the control circuits are such that a programming voltage of 5 V, for example, is biased to the bit line for a program-selected memory cell and a voltage of 0 V is biased to the bit line for a program-unselected memory cell. After the program-selected bit line is charged to 5 V, a gate signal ST00 of a selected transistor is brought to an ON-state at a timing of time t2 to connect the bit line to diffusion layer wiring. With this operation, the diffusion layer wiring D02 and D04 is charged to 5 V if they are program-selected or to 0 V if they are program-unselected. After that, the selected word line WL00 is activated to 12 V at a timing of time t3, and then TR is brought to an OFF-state at a timing of time t4 to interrupt the connection between the control circuits and the bit lines, thereby bringing the bit lines to a floating state. Then, at a timing of time t5, a selected AG gate AG01 is charged to a programming voltage of 0.6 V, for example, to supply a channel current to the selected memory cell.

For example, if a memory cell M01 is the program-selected cell, the voltages of D01, D02, the word line WL00, and the AG gate become 0 V, 5 V, 12 V, and 0.6 V, respectively; therefore, electrons are injected into a floating gate. In this case, since D02 and the bit line DL0 are in the floating state after being charged to 5 V, voltages thereof are reduced as the channel current flows to the memory cell M01, the voltages being ultimately reduced to 0 V. Here, during a period when the voltages of D02 and the bit line DL0 are biases sufficient to generate hot electrons, the electron injection into the floating gate is maintained. On the other hand, if the memory cell M01 is program-unselected, the voltages of D0, D02, the word line Wl00, and AG become 0 V, 0 V, 12 V, and about 0.6 V, respectively; therefore, the channel current does not flow so that electrons are not injected into the floating gate. Although the node for accumulating the charge is the diffusion layer wiring portion in the first embodiment, the nodes are the diffusion layer wiring portion and the bit line portion in the present embodiment; therefore, the present invention can accumulate much more charges. For example, stray capacitance of the bit line portion is about 1.0 pF, and a total of the stray capacitance of the bit line portion and the diffusion layer wiring portion is about 1.3 pF. Therefore, much more charges are accumulated in the present embodiment as compared with the first embodiment, thereby making it possible to inject much more electrons into the floating gate by one electron injection operation.

Then, AG01 is inactivated at a timing of time t6, and WL00 is inactivated at a timing of time t7. ST03 is then activated at a timing of time t8 to connect the diffusion layer wirings D02 and D04 to the common source line SS, so that the diffusion layer wirings are discharged to 0V and the operation of injecting electrons into the floating gate is completed.

After that, an operation for verifying whether or not a threshold voltage has reached a desired value is performed, and the electron injection operation is repeated for memory cells in which the desired threshold voltage has not been attained. The programming is terminated when the desired threshold voltage is attained in each of the memory cells to which the programming must be performed.

Thus, since a programming variation due to a variation in AG bias is reduced, thereby reducing the number of programming verification, it is possible to shorten time required for programming.

Further, since it is unnecessary to activate the internal power source for supplying the programming bias of 5 V during the programming, it is possible to suppress the variation in programming characteristic caused by operation noise of the internal power source and to reduce the power consumption by maintaining the internal power source in the inactive state.

In the foregoing, the operation of increasing the threshold voltage is described as the programming; however, it is possible to apply the threshold value increasing operation to an erase operation.

Also, in the case of the multilevel memory, wherein a memory cell is capable of having two or more threshold voltages, the effect of the present method become more prominent. In the multilevel memory, since it is necessary to control with high precision the threshold voltages for data, the number of threshold voltage verification is increased if the programming variation is great, thereby reducing the programming speed. In the present method, the programming variation is reduced to suppress the number of threshold voltage verification, thereby increasing the programming speed.

Further, the present embodiment has an advantage that much more charges can be accumulated as compared with the first embodiment so that much more electrons can be injected into the floating gate by one electron injecting operation.

In addition, the same effect is achieved if the memory cell is the one wherein the charge accumulation node of the present embodiment is formed of a silicon nitride film or a multilayer of a silicon nitride film and a silicon oxide film in place of the polysilicon film.

Alternatively, the same effect is achieved if the memory cell is the one wherein the charge accumulation node is formed of a plurality of polysilicon particles in the form of dots in place of the polysilicon film.

Further, in the case of using the silicon nitride film or the dotted polysilicon particles as the charge-injected portion, the same effect is achieved if the memory cell is the one wherein the polysilicon gate having the same function as that of the third gate is provided on each side of the charge-injected portion via a silicon oxide film. In this case, the charge-injected portion can discretely retain charges at two places close to the respective adjacent polysilicon gates, and thus, the multilevel memory is realized by the different charge accumulation places.

<Embodiment 3>

Figure 9:
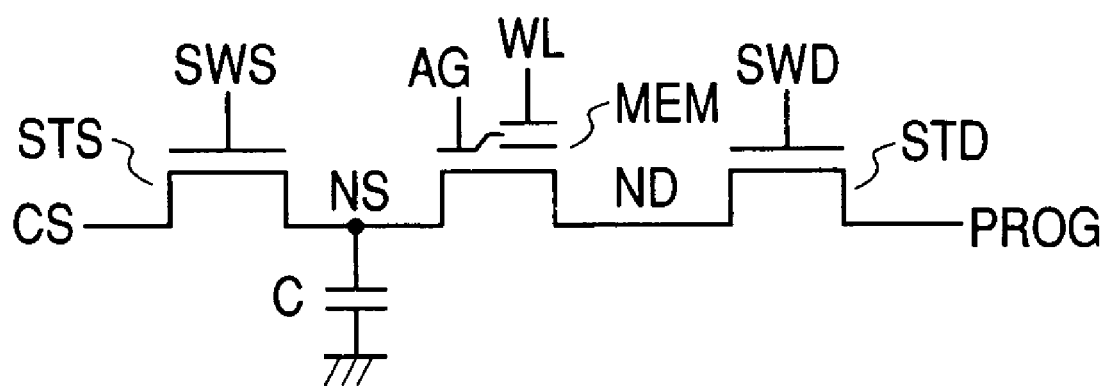
FIG. 9 is a circuit diagram illustrating the first embodiment of the present invention.
Figure 10:
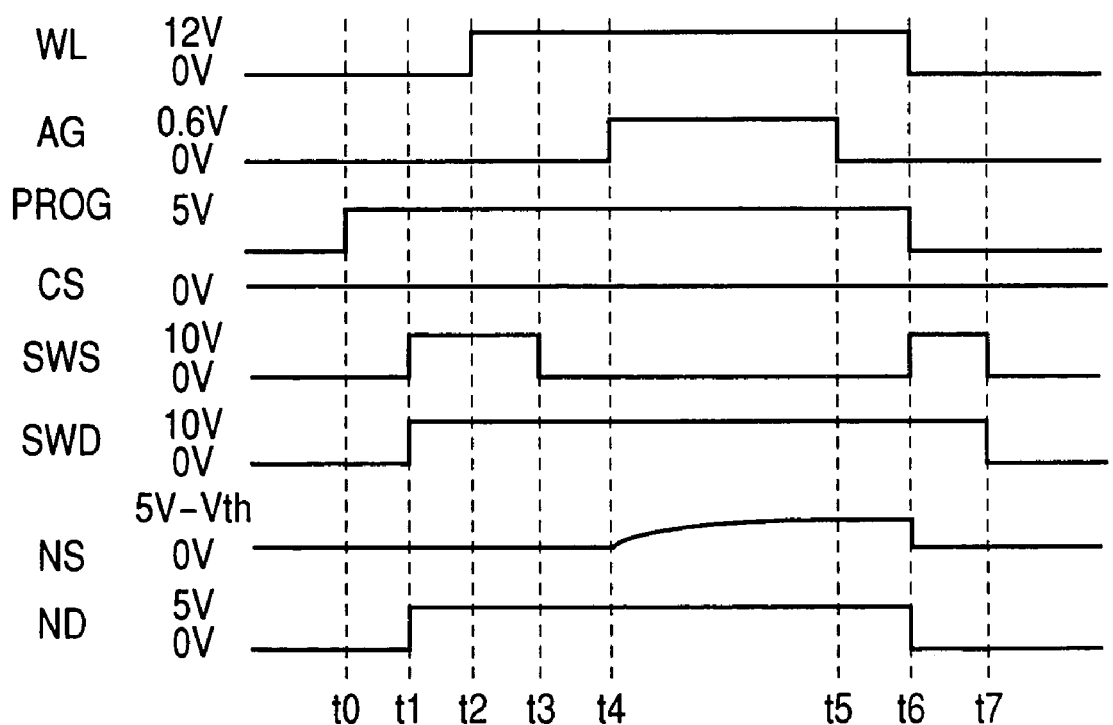
FIG. 10 is a diagram showing timings in the circuit diagram of FIG. 9.

A third embodiment will be described with reference to FIGS. 6 and 9 to 11. FIG. 9 is a circuit diagram which is directed to one of memory cells of the memory array structure shown in FIG. 2, and FIG. 10 is a diagram showing a programming operation scheme of the present embodiment. As shown in FIG. 10, an internal power source PROG for supplying a channel current is activated to 5 V at a timing of time t0; STS and STD, which are switching MOS on the source side and the drain side, respectively, of a selected memory cell, are brought to an ON-state at a timing of t1; and a programming voltage of 12 V is applied to a word line WL of the selected memory cell at a timing of time t2. Then, STS which is the switching MOS on the source side is brought to an OFF-state at a timing of time t3 to bring a node NS to a floating state. After that, a voltage of about 0.6 V is biased to AG of the selected memory cell at a timing of time t4 so that a current starts to flow to the memory cell from the internal power source PROG via the switching MOS STD. Here, hot electrons generated in a channel region of the memory cell are injected into a floating gate to achieve programming. A voltage of a node ND on the drain side is constant at 5 V, for example, while a voltage of the node NS on the source side is increased with the flow of the channel current. When the MOS formed of an AG gate portion is brought to an OFF-state due to the increase in the voltage of the node NS, the programming is stopped.

The first and second embodiments described above is characterized in that the programming is performed by the use of hot electrons generated by supplying the accumulated charge to the memory cell, the present embodiment is characterized by accumulating charges at certain capacitance via a memory cell so as to perform the programming by the use of hot electrons generated by the charge accumulation.

Figure 11:
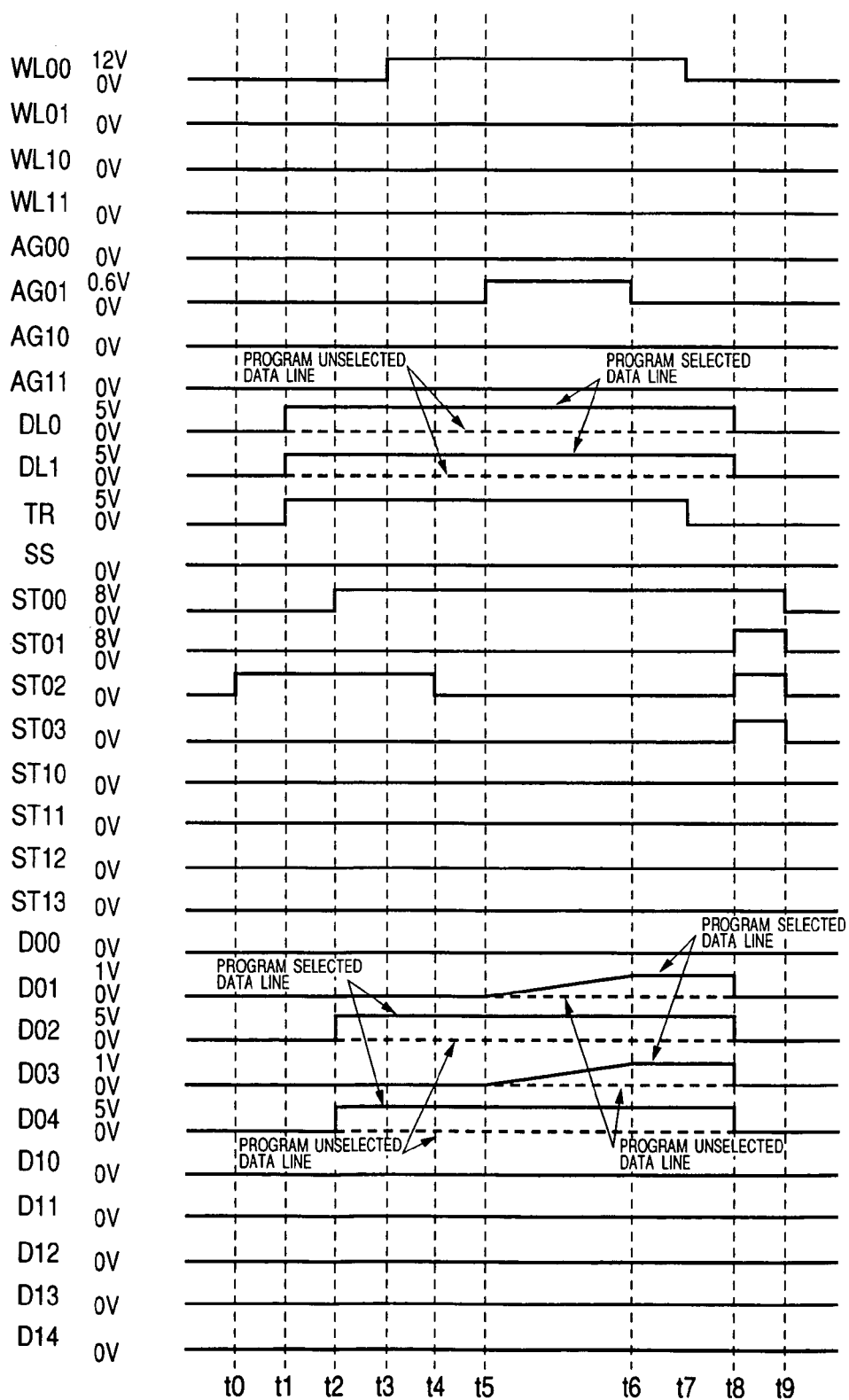
FIG. 11 is a diagram illustrating timings in a programming operation according to a third embodiment.

The present embodiment will be described in more details with reference to FIGS. 6 and 11. Shown in FIG. 11 is a programming operation of the present invention in the array structure shown in FIG. 6. The array structure of FIG. 6 is the same as that as described in Embodiment 1, wherein it is assumed that a memory cell for programming is a word line WL00. After a programming command and programming data are inputted, ST02 is activated at a timing of time t0 to connect diffusion layer wiring D01 and D03 to a common source line. Then, TR is brought to a High state at a timing of time t1 to connect control circuits PC0 and PC1 to metal bit lines DL0 and DL1, respectively. Here, voltages applied from the control circuits are such that a programming voltage of 5 V, for example, is applied to the bit line for a program-selected memory cell and a voltage of 0 V is applied to the bit line for a program-unselected memory cell. After the program-selected bit line is charged to 5 V, a gate signal ST00 of a selected transistor is brought to an ON-state at a timing of time t2 to connect the bit line to diffusion layer wiring. With this operation, the diffusion layer wiring D02 and D04 are charged to 5 V if they are program-selected or to 0 V if they are program-unselected. After that, the selected word line WL00 is activated to 12 V at a timing of time t3, and then ST02 is brought to an OFF-state at a timing of time t4 to interrupt the connection between the common source line and the diffusion layer wiring D01 and D03. Then, a selected AG gate AG01 is charged to a programming voltage of 0.6 V, for example, at a timing of time t5 to let a channel current flow to the selected memory cell. For example, if a memory cell M01 is a program-selected cell, the voltages of D01, D02, the word line WL00, and the AG gate become 0 V, 5 V, 12 V, and 0.6 V, respectively; therefore, electrons are injected into a floating gate. In this case, as the channel current flows to the memory cell M01, a voltage of D01 is increased to bring MOS formed of the AG gate portion to an OFF-state, thereby stopping the programming. On the other hand, if the memory cell M01 is program-unselected, the voltages of D01, D02, the word line Wl00, and AG become 0 V, 0 V, 12 V, and about 0.6 V, respectively; therefore, the channel current does not flow and electrons are not injected into the floating gate. Then, AG01 is inactivated at a timing of time t6, and WL00 and TR are inactivated at a timing of time t7. ST01, ST02, and ST03 are activated at a timing time t8 to discharge the bit line and the diffusion layer wiring to 0V, thereby completing the operation of injecting electrons into the floating gate.

After that, an operation for verifying whether or not a threshold voltage has reached a desired value is performed, and the electron injection operation is repeated for memory cells in which the desired threshold voltage has not been attained. The programming is terminated when the desired threshold voltage is attained in each of the memory cells to which the programming must be performed.

Thus, since a programming variation due to a variation in AG bias is reduced, thereby reducing the number of programming verification, it is possible to reduce time required for programming.

In the foregoing, the operation of increasing the threshold voltage is described as the programming; however, it is possible to apply the threshold value increasing operation to an erase operation.

Also, in the case of the multilevel memory, wherein a memory cell is capable of having two or more threshold voltages, the effect of the present method become more prominent. In the multilevel memory, since it is necessary to control the threshold voltages for data with high precision, if the programming variation is great, the number of threshold voltage verification is increased, thereby reducing the programming speed. In the present method, the programming variation is reduced to suppress the number of threshold voltage verification, thereby increasing the programming speed.

In addition, the same effect is achieved if the memory cell is the one wherein the charge accumulation node of the present embodiment is formed of a silicon nitride film or a multilayer of a silicon nitride film and a silicon oxide film in place of the polysilicon film.

Alternatively, the same effect is achieved if the memory cell is the one wherein the charge accumulation node is formed of a plurality of polysilicon particles in the form of dots in place of the polysilicon film.

Further, in the case of using the silicon nitride film or the dotted polysilicon particles as the charge-injected portion, the same effect is achieved if the memory cell is the one wherein a polysilicon gate having the same function as that of the third gate is provided at each side of the charge-injected portion via a silicon oxide film. In this case, the charge-injected portion can discretely retain charges at two places close to the respective adjacent polysilicon gates, and thus, the multilevel memory is realized by the different charge accumulation places.

<Embodiment 4>

Figure 12:
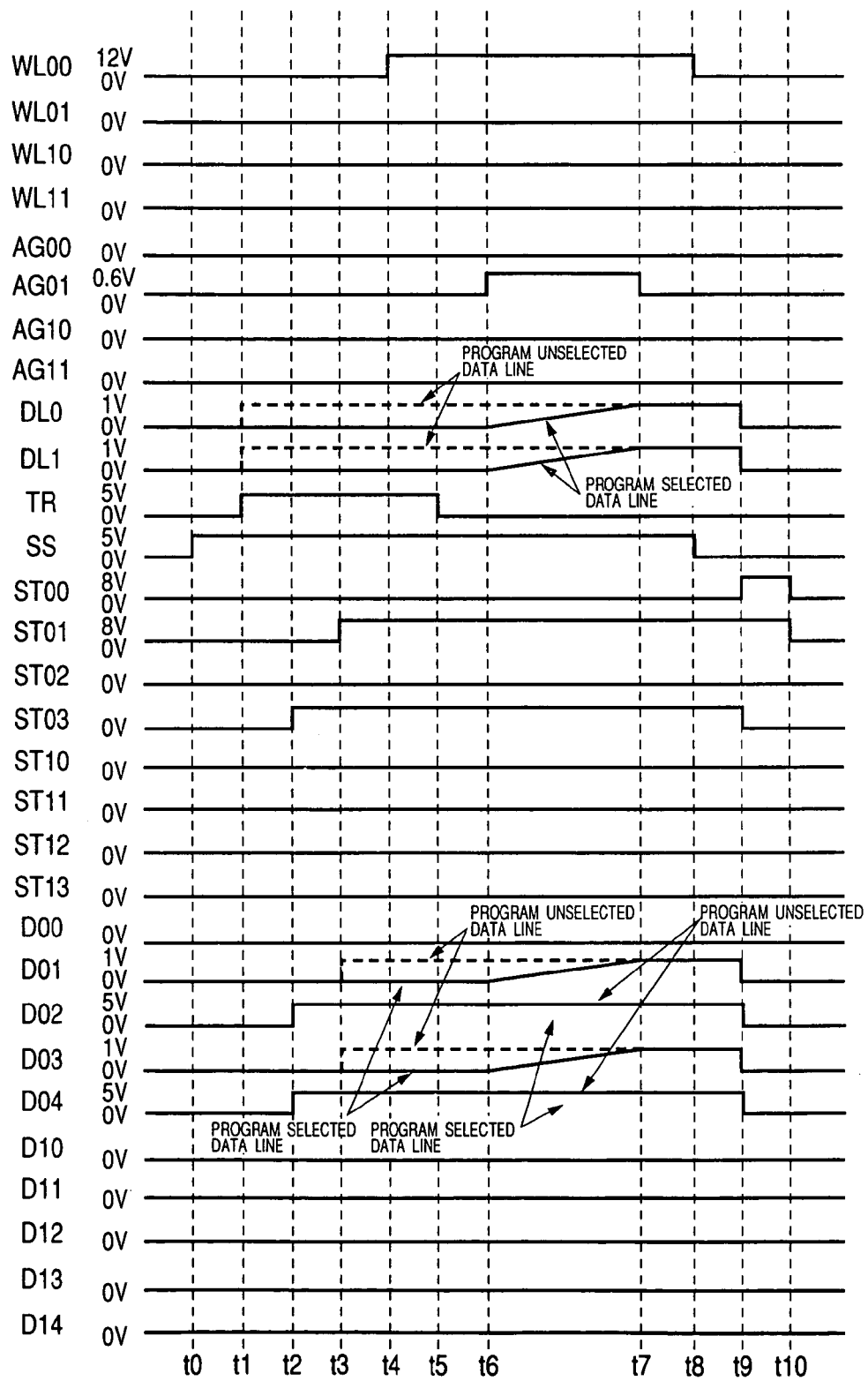
FIG. 12 is a diagram illustrating timings in a programming operation according to a fourth embodiment.

A fourth embodiment of the present invention will be described with reference to FIGS. 6 and 12. FIG. 12 is a diagram showing a programming operation scheme of the present invention in the array structure shown in FIG. 6. The array structure of FIG. 6 is the same as that described in Embodiment 1, and it is assumed that the memory cell for programming is a word line WL00.

After a programming command and programming data are inputted, a common source line SS is activated to 5 V at a timing of time t0. Then, TR is activated at a timing of time t1 to connect control circuits to metal bit lines. Here, the control circuits output voltages to the bit lines for the programming data. For example, a voltage of 0V is biased to the bit line for the program-selected memory cell, and a voltage of 1 V is biased to the bit line for the program-unselected memory cell. After that, the gate signal ST03 of the selected transistor is brought to a High state at a timing of time t2 to charge diffusion layer wirings D02 and D04 to 5 V. Then, a gate signal ST01 of a selected transistor is brought to a High state at a timing of time t3 to connect the bit lines DL0 and DL1 to diffusion layer wiring D01 and D03, respectively. Here, a voltage of each of the program-selected D01 and D03 of is 0 V, while a voltage of each of the program-unselected D01 and D03 is 1 V.

After activating the selected word line WL00 to a programming voltage of 12 V, for example, at a timing of time t4, TR is brought to a LOW state at a timing of time t5 to disconnect the diffusion layer wiring D02 and D04 from the common source line. Then, a programming voltage of about 0.6 V, for example, is biased to AG01 which is a selected AG gate. If a memory cell M01 is the program-selected cell, voltages applied to DL0 and DL1, D02, the word line WL00, and the AG gate are 0 V, 5 V, 12 V, and 0.6 V, respectively; therefore, electrons are injected into the floating gate. In this case, since the bit line DL0 is in a floating state, charges are charged to increase a voltage as the channel current flows to the memory cell M01 to bring MOS formed of a AG gate portion to OFF-state, thereby stopping the programming. Although the node for accumulating the charge is the diffusion layer wiring portion in the third embodiment, the diffusion layer wiring portion and the bit line portion are used as the nodes in the present embodiment; therefore, the present invention can accumulate much more charges. For example, stray capacitance of the bit line portion is about 1.0 pF, and a total of the stray capacitance of the bit line portion and the diffusion layer wiring portion is about 1.3 pF. Therefore, much more charges are accumulated in the present embodiment as compared with the first embodiment, thereby making it possible to inject much more electrons into the floating gate by one electron injection operation.

On the other hand, if the memory cell M01 is program-unselected, voltages biased to DL1 and DL2, D02, the word line WL00, and AG01 are 1 V, 5 V, 12 V, and about 0.6 V, respectively; therefore, no channel current flows and no electron injection to the floating gate occurs.

AG01 is inactivated at a timing of time t7, and then WL00 and SS are inactivated at a timing of time t8. ST00 is then activated at a timing of time t9 to discharge the bit line and the diffusion layer wiring to 0 V, thereby completing the operation of injecting electrons into the floating gate.

After that, an operation for verifying whether or not a threshold voltage has reached a desired value is performed, and the electron injection operation is repeated for memory cells in which the desired threshold voltage has not been attained. The programming is terminated when the desired threshold voltage is attained in each of the memory cells to which the programming must be performed.

Thus, since a programming variation due to a variation in AG bias is reduced, thereby reducing the number of programming verification, it is possible to reduce time required for programming.

In the foregoing, the operation of increasing the threshold voltage is described as the programming; however, it is possible to apply the threshold value increasing operation to an erase operation.

Also, in the case of the multilevel memory, wherein a memory cell is capable of having two or more threshold voltages, the effect of the present method becomes more prominent. In the multilevel memory, since it is necessary to control the threshold voltage for the data with high precision, if the programming variation is great, the number of threshold voltage verification is increased thereby reducing the programming speed. In the present method, the programming variation is reduced to suppress the number of threshold voltage verification, thereby increasing the programming speed.

Further, the present embodiment can charge much more charges as compared with the third embodiment and has the advantage of injecting much more electrons into the floating gate by one electron injection operation.

In addition, the same effect is achieved if the memory cell is the one wherein the charge accumulation node of the present embodiment is formed of a silicon nitride film or a multilayer of a silicon nitride film and a silicon oxide film in place of the polysilicon film.

Alternatively, the same effect is achieved if the memory cell is the one wherein the charge accumulation node is formed of a plurality of polysilicon particles in the form of dots in place of the polysilicon film.

Further, in the case of using the silicon nitride film or the dotted polysilicon particles as the charge-injected portion, the same effect is achieved if the memory cell is the one wherein a polysilicon gate having the same function as that of the third gate is provided on each side of the charge-injected portion via a silicon oxide film. In this case, the charge-injected portion can discretely retain charges at two places close to the respective adjacent polysilicon gates, and the multilevel memory is realized by the different charge accumulation places.

<Embodiment 5>

Figure 13:
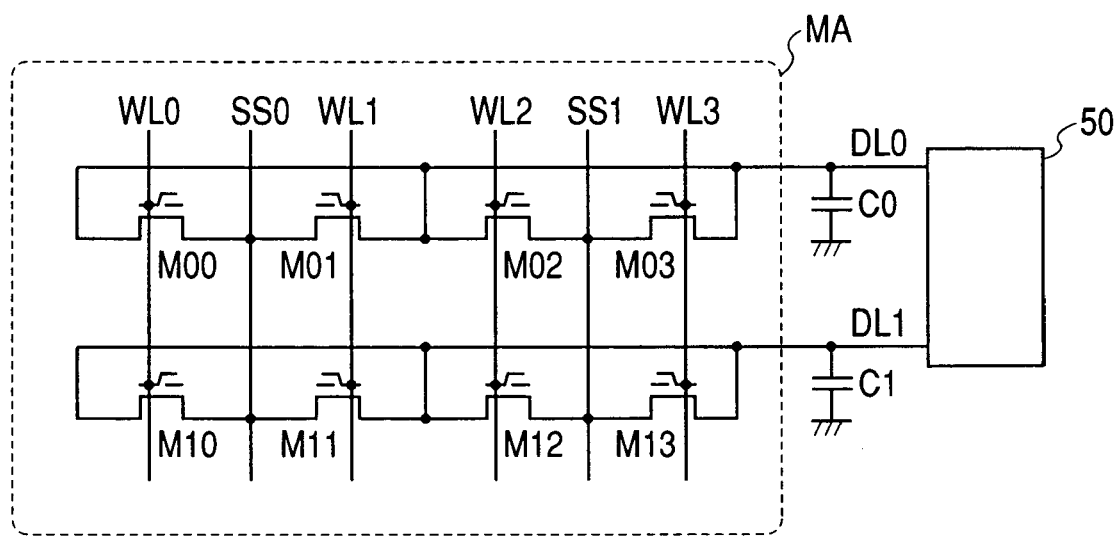
FIG. 13 is a circuit diagram illustrating a fifth embodiment of the present invention.
Figure 14:
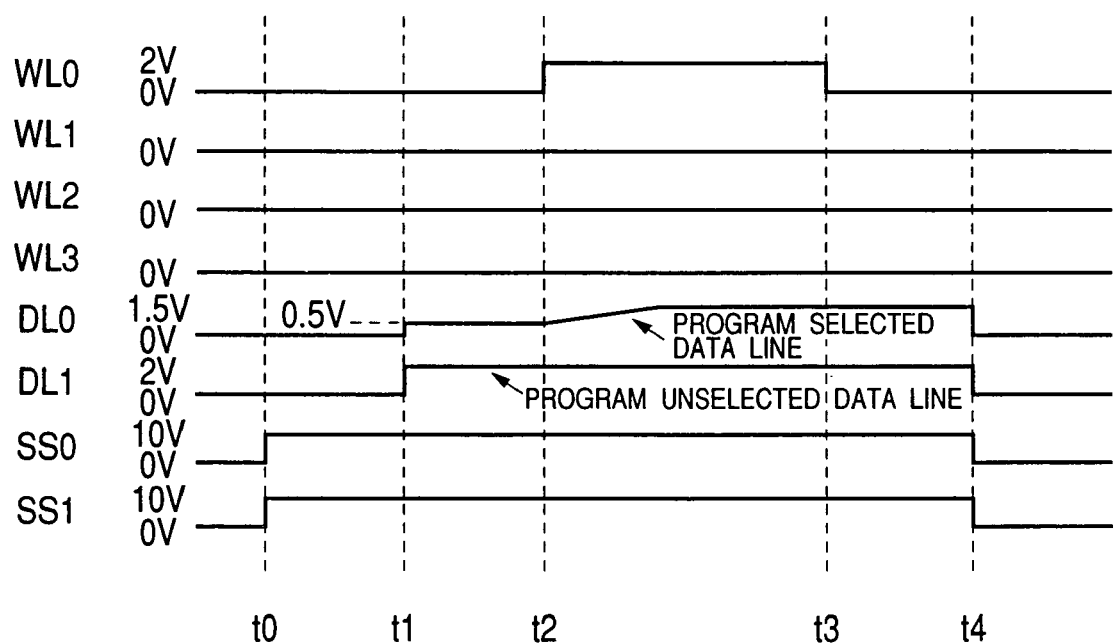
FIG. 14 is a diagram illustrating timings in the circuit of FIG. 13.

A fifth embodiment will be described with reference to FIGS. 13 to 15. FIG. 13 is a diagram showing a circuit structure according to the present embodiment. A memory array MA shown in FIG. 13 is known as an SST type memory cell which is disclosed in, for example, IEEE ELECTRON DEVICE LETTERS, VOL. 21, NO. 7, JULY 2000, p. 359–p. 361, wherein programmable/erasable memory cells are arranged in the form of arrays. Programming in the above memory cell is executed by applying voltages of 0 V, about 2 V, about 0.5 V, and about 10 V to a well, a control gate, a drain, and a source, respectively, thereby injecting electrons into a floating gate by a SSI (Source Side Injection) method. An erase operation is executed by applying a voltage of about 12 V to the control gate and a voltage of 0 V to the source, the drain, and the well, thereby discharging electrons which have been injected in the floating gate to the control gate. A read operation is executed by applying voltages of about 3 V and about 2 V to the control gate and the drain, respectively, and a voltage of 0 V to the source and the well, and by detecting a memory cell current.

In the programming operation of the memory cell, since the control gate is activated by applying a voltage which is approximately equal to the threshold voltage of a MOS transistor formed of a control gate portion, a dimensional variation in the control gates and a variation in the applied voltages may greatly influence a programming characteristic of the memory cell. This is the same as the case of the memory cell with AG gate described in the first to fourth embodiments. The present embodiment is characterized by providing a capacitance element between a programming control circuit and a memory cell so that the variation in the programming can be reduced in the memory array structure described above. Hereinafter, a specific description of the present embodiment will be given with reference to FIGS. 13 and 14. Denoted by M00 is a program-selected cell. After a programming command and programming data are inputted, source lines SS0 and SS1 are activated to about 10 V at a timing of time t0. Then, voltages for the programming data are outputted from a programming control circuit 50 to bit lines at a timing of time t1. Under an assumption that the bit line DL0 is a selected bit line and the bit line DL1 is an unselected bit line, the voltages applied to DL0 and DL1 are 0.5 V and 2 V, respectively. After the completion of charging to the bit lines, the connections between the programming control circuit 50 and the bit lines are interrupted, and, after that, a selected control gate WL0 is activated to 2 V at a timing of time t2. Since voltages of 2 V, 10 V, 0.5 V, and 0V are biased to the control gate, the source, the drain, and the well, respectively, in the selected memory cell M00, electrons are injected into the floating gate. On the other hand, in a program-unselected memory cell M10, since a voltage of 2 V is applied to the drain although voltages of 2 V, 10 V, and 0 V are applied to the control gate, the source, and the well, respectively, no channel current flows to the memory cell so that programming is not executed. In this case, since the capacitance element C0 is connected to DL0, charges are accumulated in the capacitance element C0 with the flow of a channel current to the memory cell M00. When a voltage of DL0 is increased to a certain level by accumulating the charge in C0, the memory cell M00 is brought to OFF-state to stop the programming. After that, the control gate WL0 is inactivated at a timing of time t3, and the source lines SS0 and SS1 as well as the bit lines DL0 and DL1 are discharged to 0 V so that the electron injection operation is terminated.

After this, an operation for verifying whether or not a threshold voltage has reached a desired value is performed, and the electron injection operation is repeated for memory cells in which the desired threshold voltage has not been attained. The programming is terminated when the desired threshold voltage is attained in each of the memory cells to which the programming must be performed.

Thus, since a programming variation due to a variation in control gate bias can be reduced, thereby reducing the number of programming verification, it is possible to reduce time required for programming.

Figure 15:
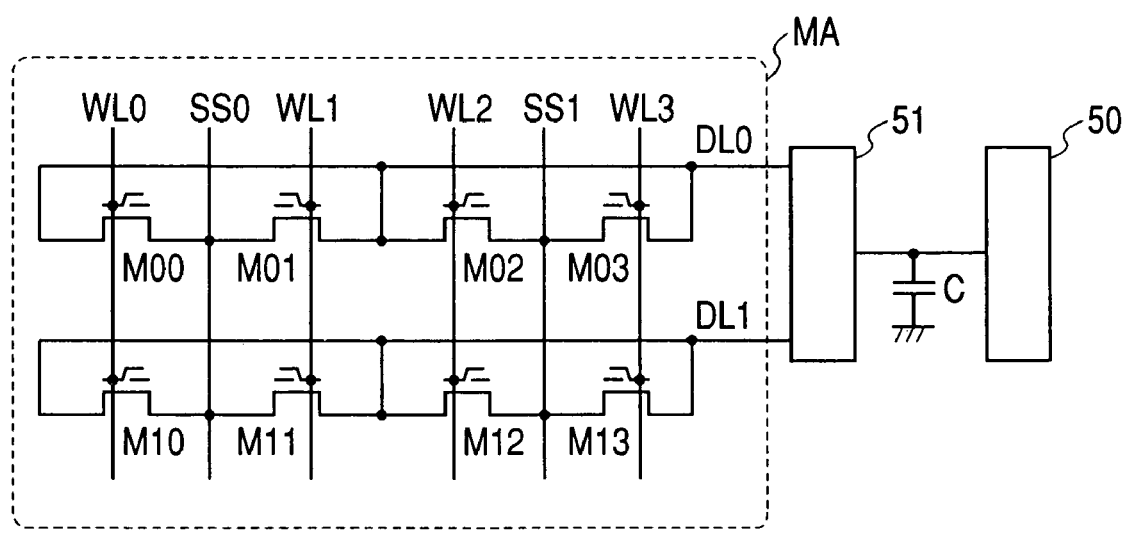
FIG. 15 illustrates a circuit configuration for realizing the fifth embodiment, the circuit configuration being different from that of FIG. 13.

The above effect can be realized by a structure shown in FIG. 15 where capacitance C for programming is provided between a decoder circuit 51 for decoding a plurality of bit lines and a programming control circuit. In such structure, it is possible to increase a value of the programming capacitance because the capacitance is shared by the plurality of bit lines.

The capacitance element described above may be stray capacitance of the bit line formed of metal. Also, the structure may be MIM (Metal-Insulator-Metal) structure wherein an insulator film is sandwiched between metal layers or MOS capacitance structure which is widely used in ordinary circuit structures.

In the foregoing, the operation of increasing the threshold voltage is described as the programming; however, it is possible to apply the threshold value increasing operation to an erase operation.

Also, in the case of the multilevel memory, wherein a memory cell is capable of having two or more threshold voltages, the effect of the present method become more prominent. In the multilevel memory, since it is necessary to control the threshold voltages for the data with high precision, if the programming variation is great, the number of threshold voltage verification is increased thereby reducing the programming speed. In the present method, the programming variation is reduced to suppress the number of threshold voltage verification, thereby increasing the programming speed.

In addition, the same effect is achieved if the memory cell is the one wherein the charge accumulation node of the present embodiment is formed of a silicon nitride film, a multilayer of a silicon nitride film and a silicon oxide film, or a plurality of polysilicon particles in the form of dots in place of the polysilicon film.

Further, in the case of using the silicon nitride film or the dotted polysilicon particles as the charge-injected portion, the same effect is achieved if the memory cell is the one wherein a polysilicon gate having the same function as that of the third gate is provided on each side of the charge-injected portion via a silicon oxide film. In this case, the charge-injected portion can discretely retain charges at two places close to the respective adjacent polysilicon gates, and the multilevel memory is realized by the different charge accumulation portions.

Although the description has been made of the SST memory cell in the foregoing, the present embodiment is applicable to a virtual ground type memory cell using a three-layer polysilicon gate, which is disclosed in Japanese Patent No. 2694618, and an ordinary NOR memory cell. Note that, since the NOR memory cell typically has as relatively small as injection efficiency of about $10^{-5}$ to $10^{-6}$, it is necessary to increase a value of the programming capacitance. It is desirable to provide capacitance of about 100 pF to 1 nF. Such capacitance cannot usually be realized by diffusion layer capacitance or stray capacitance of bit line, but realized by the capacitance of the MIM structure, MOS capacitance, or external capacitance provided externally to a chip.

<Embodiment 6>

Figure 16:
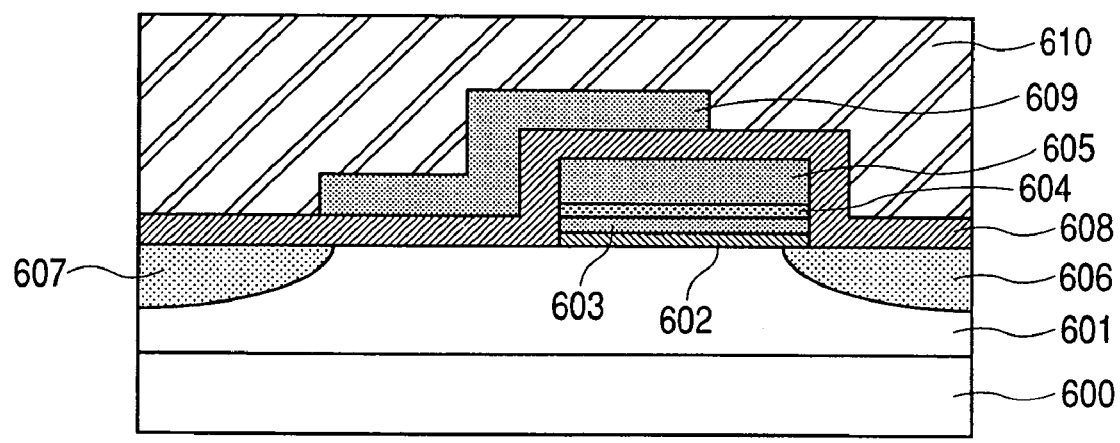
FIG. 16 is a cross-sectional view of a nonvolatile memory according to a sixth embodiment.
Figure 17:
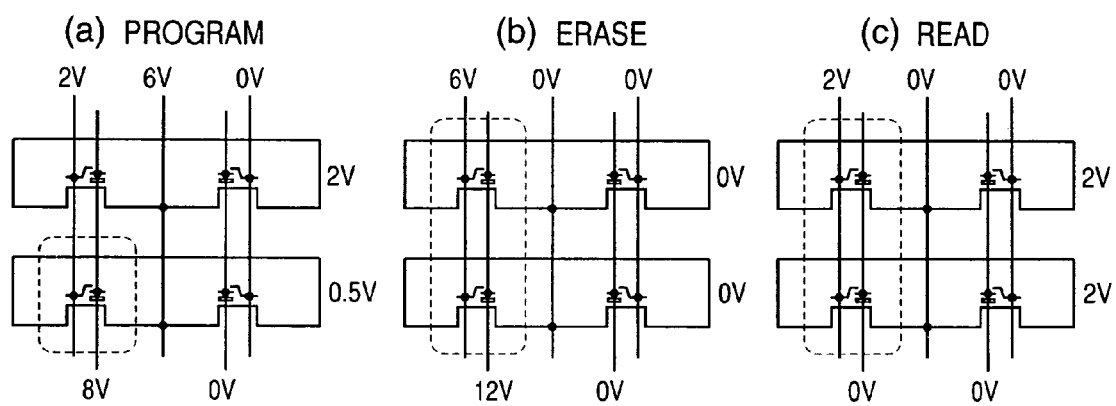
FIG. 17 includes diagrams showing operation voltage conditions of the flash memory.

A sixth embodiment of the present invention will be described with reference to FIGS. 16 to 20. FIG. 16 is a cross-sectional view showing a memory cell of the present embodiment. The memory cell has a well 601 formed in a substrate 600, a source diffusion layer region 606 and a drain diffusion layer region 607 both of which are formed in the well, a silicon oxide film 602, a silicon nitride film 603, a silicon oxide film 604, a polysilicon gate 605 which will be formed into a first gate, and a polysilicon gate 609 which will be formed into a second gate; the silicon oxide film 602, the silicon nitride film 603, and the silicon oxide film 604 being formed in this order above the well, the polysilicon gate 605 being formed on the silicon oxide film 604, and the polysilicon gate 609 being formed above the first gate and the well via a silicon oxide film 608. The basic operation of the memory cell will be described with reference to FIG. 17. FIG. 17 is a diagram showing an array structure in which the memory cells are arranged in the same manner as that of Embodiment 5, wherein an erase operation, programming operation, and read operation are illustrated. As shown in FIG. 17(a), the programming operation is performed by applying voltages of about 8 V, about 2 V, about 6 V, and about 0.5 V to the first gate, the second gate, the source, and the drain, respectively, of a selected memory cell to generate hot electrons and injecting the hot electrons into the silicon nitride film serving as a charge-injected portion to trap the electrons, thereby increasing a threshold voltage. Referring to FIG. 17(b), the erase operation is performed by applying voltages of about 12 V and about 6 V to the first gate and the second gate, respectively, of the selected cell to discharge the electrons trapped in the silicon nitride film to the first gate, thereby lowering the threshold voltage. Referring to FIG. 7(c), the read operation is performed by applying voltages of about 2 V, 0 V, and about 2 V to the drain, the source and the first gate, and the second gate, respectively, to judge data on the basis of an amount of current supplied to the memory cell. A current flowing through the memory cell in a programming state is small because the electrons are trapped by the trap of the silicon nitride film which is the charge-injected portion, while a current flowing through the memory cell in an erasing state is larger than that flowing through the memory cell in the programming state because no electron is trapped in the charge-injected portion.

In the programming operation of the memory cell, since the operation is performed by applying to a second gate portion the voltage approximately equal to a threshold voltage of a MOS transistor formed of the second gate portion, a dimensional variation in the second gates and a variation in the applied voltages greatly influence a programming characteristic of the memory cell. This is the same as the case of the memory cell with AG gate of the first to fourth embodiments. The present embodiment is characterized by providing a capacitance element between a programming control circuit and a memory cell so that the variation in the programming is reduced in the memory array structure.

Figure 18:
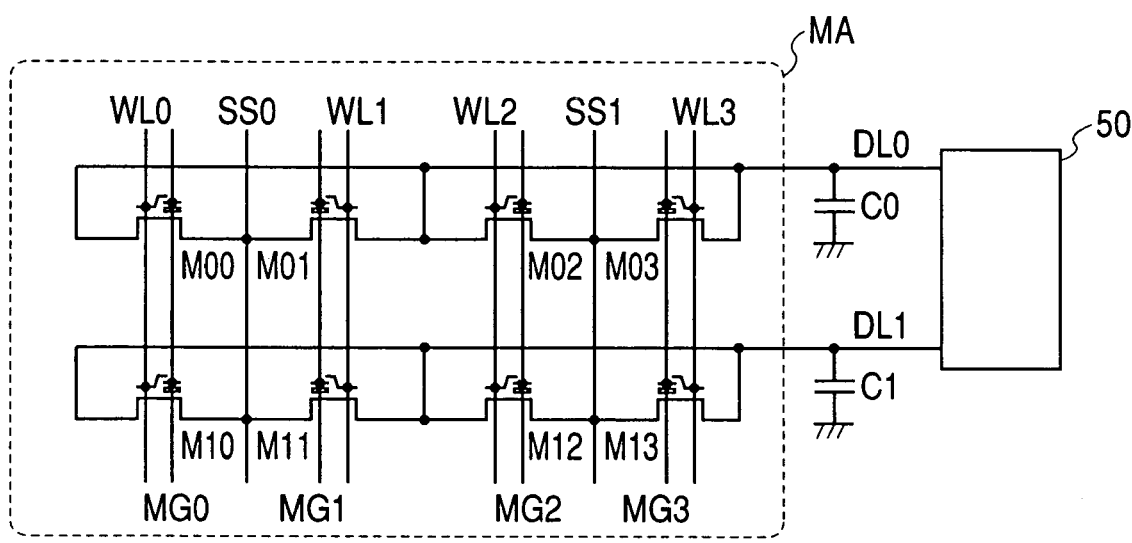
FIG. 18 is a circuit diagram illustrating the sixth embodiment.
Figure 19:
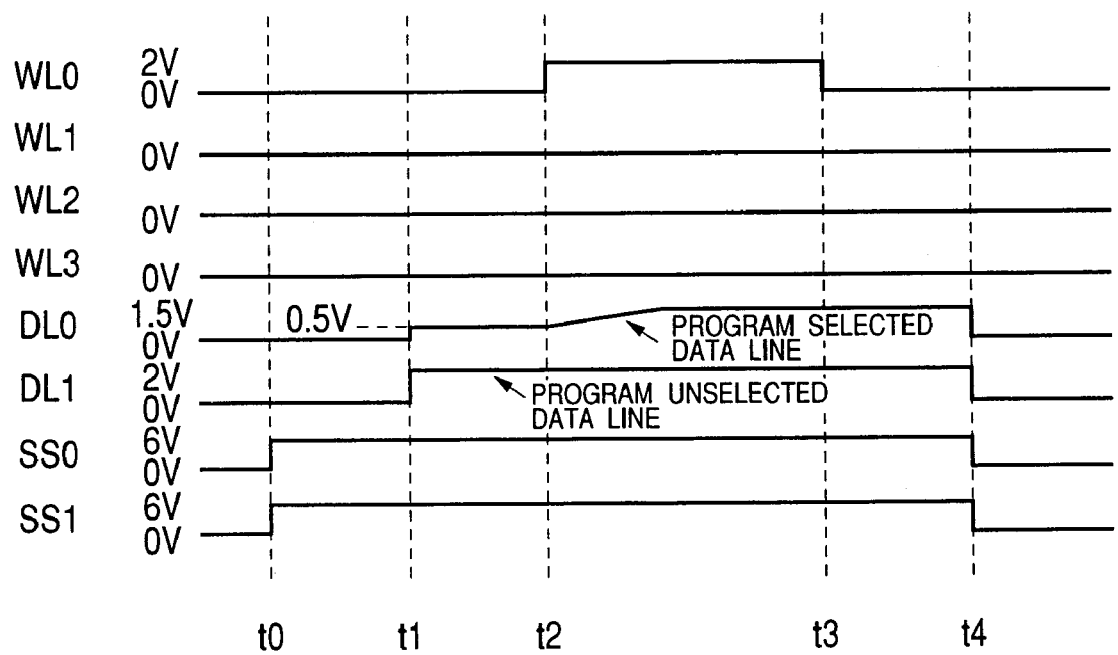
FIG. 19 is a diagram showing timings in the circuit diagram of FIG. 18.

Hereinafter, a specific description of the present embodiment will be given with reference to FIGS. 18 and 19. Denoted by M00 is a program-selected cell. After a programming command and programming data are inputted, source lines SS0 and SS1 are activated to about 6 V at a timing of time t0. Then, voltages for the programming data are outputted from the programming control circuit 60 to bit lines at a timing of time t1. Under an assumption that the bit line DL0 is a selected bit line and the bit line DL1 is an unselected bit line, the voltages applied to DL0 and DL1 are 0.5 V and 2 V, respectively. After the completion of charging the bit lines, the connections between the programming control circuit 60 and the bit lines are interrupted, and then a selected control gate WL0 is activated to 2 V at a timing of time t2. Since voltages of 2 V, 6 V, 0.5 V, and 0V are applied to the control gate, the source, the drain, and the well, respectively, in the unselected memory cell M00, electrons are injected into the floating gate. On the other hand, since a voltage of 2 V is applied to the drain although voltages of 2 V, 6 V, and 0 V are applied to the control gate, the source, and the well, respectively, in an unselected memory cell M10, programming is not executed. In this case, the capacitance element C0 is connected to DL0 so that charges are accumulated in the capacitance C0 as a channel current flows through the memory cell M00. When a voltage of DL0 is increased to a certain level by the accumulation of charges in C0, the memory cell M00 is brought to an OFF-state thereby stopping the programming. After that, the control gate WL0 is inactivated at a timing of time t3, and the source lines SS0 and SS1 as well as the bit lines DL0 and DL1 are discharged to 0 V at a timing of time t4 so that the electron injection operation is terminated.

After that, an operation for verifying whether or not a threshold voltage has reached a desired value is performed, and the electron injection operation is repeated for memory cells in which the desired threshold voltage has not been attained. The programming is terminated when the desired threshold voltage is attained in each of the memory cells to which the programming must be performed.

Thus, since the programming variation due to the variation in control gate bias is reduced, thereby reducing the number of programming verification, it is possible to reduce time required for programming.

Figure 20:
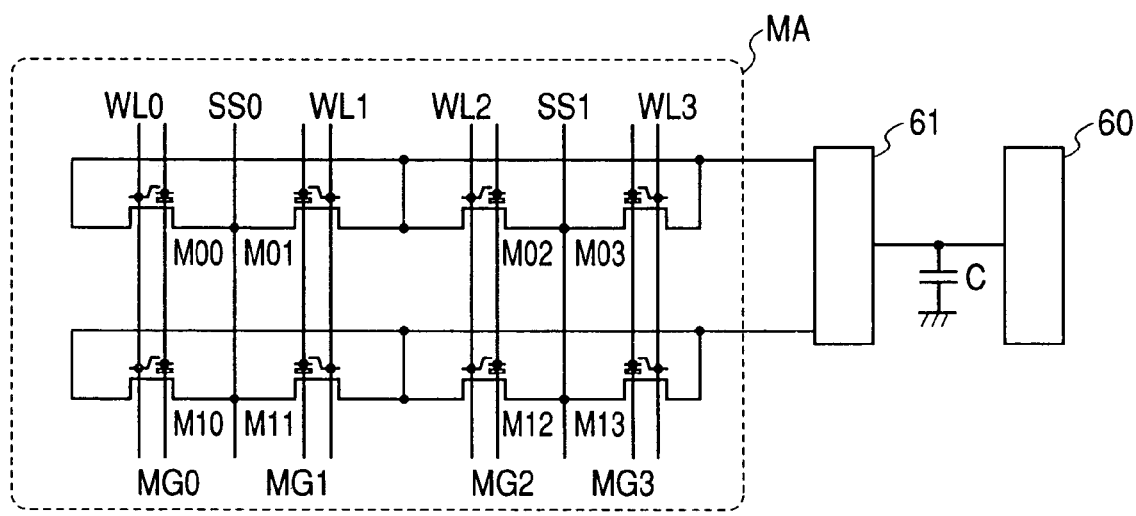
FIG. 20 is a circuit configuration for realizing the fifth embodiment, the circuit configuration being different from that of FIG. 18.

The above effect can be realized by a structure shown in FIG. 20 where programming capacitance C is provided between a decoder circuit 61 for decoding a plurality of bit lines and a programming control circuit. In such structure, it is possible to increase a value of the programming capacitance because the capacitance is shared by the plurality of bit lines.

The capacitance element described above may be stray capacitance of the bit line formed of metal.

In the foregoing, the operation of increasing the threshold voltage is described as the programming; however, it is possible to apply the threshold value increasing operation to an erase operation.

Also, in the case of the multilevel memory, wherein a memory cell is capable of having two or more threshold voltages, the effect of the present method become more prominent. In the multilevel memory, since it is necessary to control the threshold voltages for data with high precision, if the programming variation is great, the number of threshold voltage verification is increased, thereby reducing the programming speed. In the present method, the programming variation is reduced to suppress the number of threshold voltage verification, thereby increasing the programming speed.

In addition, the same effect is achieved if the memory cell is the one wherein the charge accumulation node of the present embodiment is formed of a plurality of polysilicon particles in the form of dots in place of the silicon nitride film.

Further, in the case of using the silicon nitride film or the dotted polysilicon particles as the charge-injected portion, the same effect is achieved if the memory cell is the one wherein a polysilicon gate having the same function as that of the third gate is provided at each of the sides of the charge-injected portion via a silicon oxide film. In this case, the charge-injected portions can discretely retain charges at two places close to the respective adjacent polysilicon gates, and the multilevel memory is realized by the different charge-injected places.

<Embodiment 7>

Figure 21:
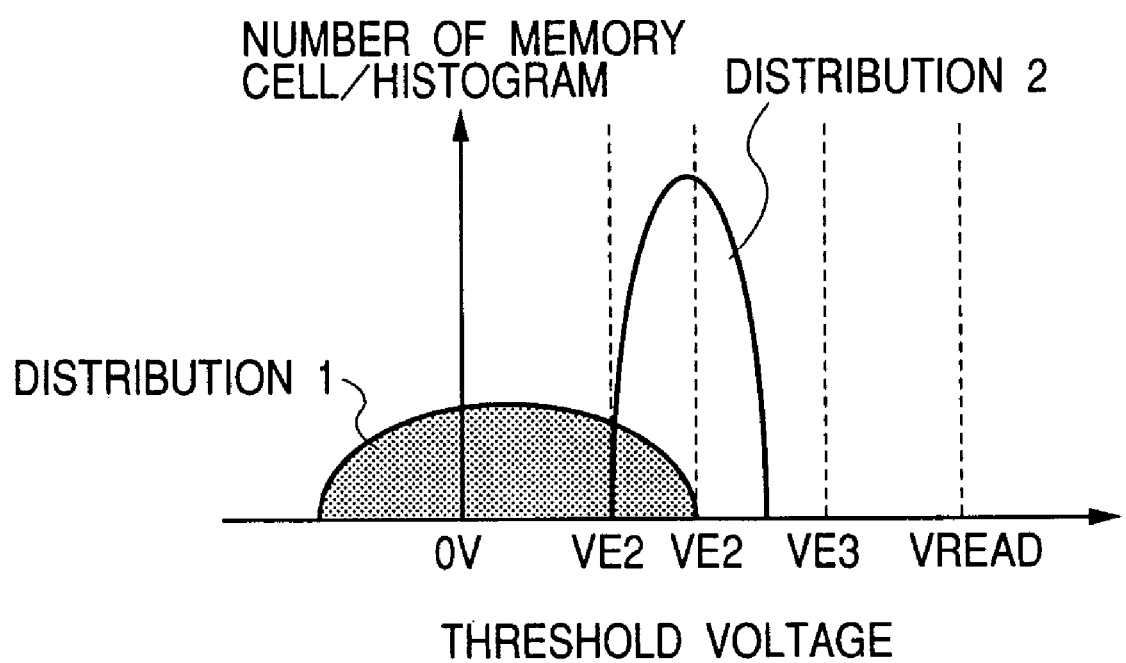
FIG. 21 is diagram showing a threshold voltage distribution according to a seventh embodiment.
Figure 22:
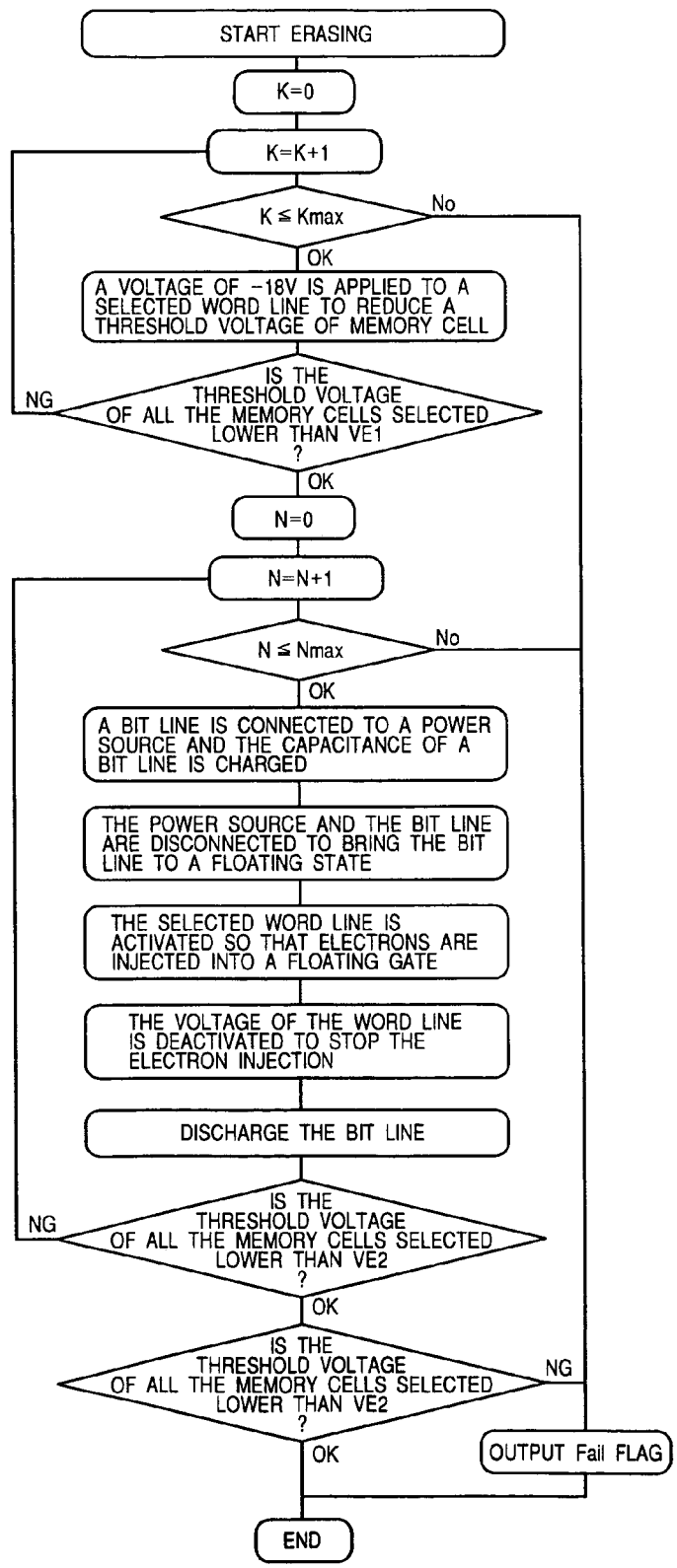
FIG. 22 is a flowchart illustrating a programming method according to the seventh embodiment.

A seventh embodiment of the present invention will be described with reference to FIGS. 21 and 22. In the array structure shown in FIG. 6, if a memory sell unselected for reading-out has a negative threshold voltage, conduction to the unselected memory cell is established when a voltage of an unselected word line is 0 V, thereby preventing a threshold voltage of a selected memory cell from being detected precisely. Therefore, the threshold voltage of the memory cell must be maintained at 0 V or more.

In the case of performing an erase operation by reducing a threshold voltage of a memory cell, there is known a method of applying a negative high voltage, e.g., −18 V, to a target for erase, e.g., a word line so as to reduce the threshold voltage of the memory cell by the word line unit. In this case, application of erasing bias and threshold voltage verification operations are repeated until the threshold voltages of all the memory cells to be erased become VE1 or less as shown in FIG. 21. As a result, it is possible that the threshold voltages after erasing have distribution 1 shown in FIG. 21 and threshold voltages of a part of the memory cells becomes lower than 0 V. As mentioned above, since the normal reading-out is prevented if a memory cell exists which has the threshold voltage lower than 0 V, it is necessary to perform a post-erase operation for increasing the threshold voltage to a level equal to 0 V or more, subsequently to the erase operation. Here, the post-erase operation is effected by setting the threshold voltages of all the memory cells to which the erasing has been performed to a level equal to VE2 or more.

In the post erase operation, since the excessively increased threshold voltage can possibly be confused with a voltage in the programming state, a threshold voltage distribution 2 after the post-erase should be suppressed to a voltage VE3 which is lower than a read voltage VREAD. If a variation in post-erase characteristic is great, a memory cell having a threshold voltage higher than VE3 may occur incidentally and a speed of the erase operation as a whole may be reduced because it is necessary to perform the bias application and the threshold voltage verification repeatedly so as to narrow the threshold value to a level in the range of VE2 to VE3.

Accordingly, if a method of any one of the first to sixth embodiments is carried out when the post-erase operation is performed by increasing the threshold voltage after the erase operation has been performed by reducing the threshold voltage, it is possible to reduce the programming variation. It is therefore possible to suppress the occurrence of the incidental error or the reduction in post-erase speed. Such post-erase operation will be described with reference to a flowchart shown in FIG. 22 based on the second embodiment.

If an erase command is inputted, a voltage of −18 V is applied to a selected word line to reduce a threshold voltage of a memory cell. After that, threshold voltage verification is performed to judge if the threshold voltages of all the memory cells to be erased are VE1 or less. In the case of NG, an erasing pulse is applied again to reduce the threshold voltage of the relevant memory cell. In this case, if the number of repetition exceeds a predetermined value KMAX, a Fail flag is outputted as an erase failure to the external to terminate the erase. When all the threshold voltages become VE1 or lower, the post-erase operation is performed. Specifically, a bit line is connected to a power source so that the bit line is charged to 5 V. Then, the power source and the bit line are disconnected to bring the bit line to a floating state. After that, the selected word line is activated to 12 V, and an auxiliary gate is activated to 0.6 V, so that electrons are injected into a floating gate. After the lapse of a certain period of time, the voltages of the word line and the auxiliary gate are deactivated to stop the post erase operation, and then the threshold voltage verification is performed. If the threshold voltages of all the memory cells which are targets for the post erase have not reached VE2, a post erase bias is applied again to the memory cell whose threshold voltage is lower than VE2. Here, if the number of repetition exceeds a predetermined value NMAX, the Fail flag is outputted as the erase failure to the external to terminate the post-erase operation.

When the threshold voltages of the memory cells which are targets for the post erase become VE2 or more, verification of whether or not the threshold voltages are VE3 or less is performed. If a memory cell exists which has a threshold voltage higher than VE3, the Fail flag is outputted as the erase failure to terminate the post erase operation. Thus, if the threshold voltages after the post erase are from VE2 to VE3, the erase operation is terminated normally.

In the case of outputting the Fail flag, it is desirable that the threshold voltages of all the memory cells to be erased are set to a level above a predetermined voltage in advance.

Although the description has been made on the basis of the second embodiment in the foregoing, the post erase operation is applicable to the first and third to sixth embodiments.

<Embodiment 8>

Figure 23:
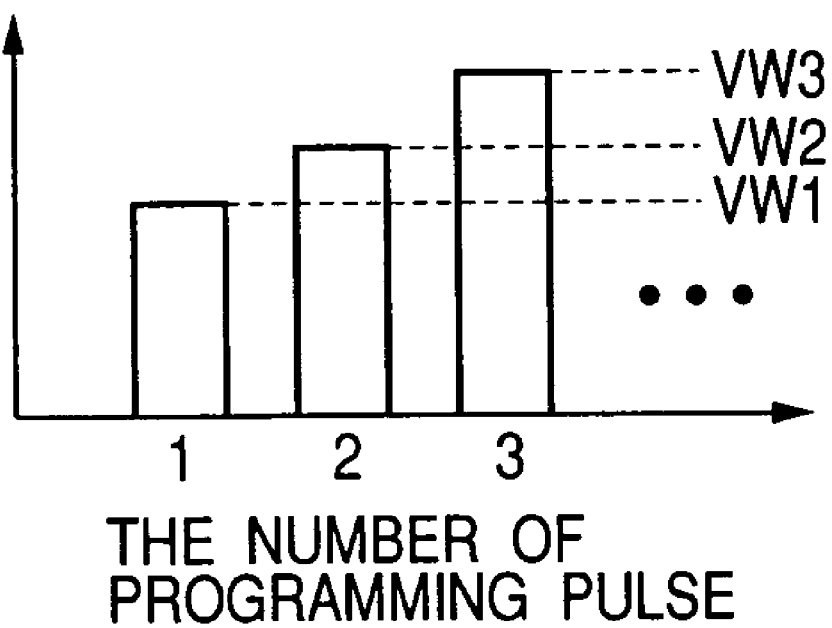
FIG. 23 is a diagram showing timings in a programming operation according to an eighth embodiment.

An eighth embodiment of the present invention will be described with reference to FIGS. 23 and 24. In the case of performing programming by increasing a threshold voltage of a memory cell according to any one of the first to seventh embodiments, the electron injection efficiency deteriorates with the progress of the programming to the memory cell and the increase in threshold voltage. Therefore, if the bias of a memory cell on which the programming is performed earlier in the order of programming is set to a value which prevents a threshold voltage from exceeding a desired value, it is necessary to perform the pulse application and the threshold voltage verification repeatedly until a memory cell on which the programming is performed later reaches a desired threshold voltage, thereby reducing the programming speed.

Thus, in order to maintain the electron injection efficiency at a constant value, it is necessary to increase the bias to be applied to a memory cell for each programming pulse. Shown in FIG. 23 is an example of the bias increment, wherein a voltage to be applied to a selected word line is increased as shown by VW1, VW2, VW3, etc. with the increase in programming pulse cycles. Since the efficiency of injecting electrons into a floating gate is increased with an increase in a word line voltage, it is possible to perform programming with the electron injection efficiency being maintained constant by properly setting VW1, VW2, VW3, etc. in accordance with a memory cell characteristic.

Figure 24:
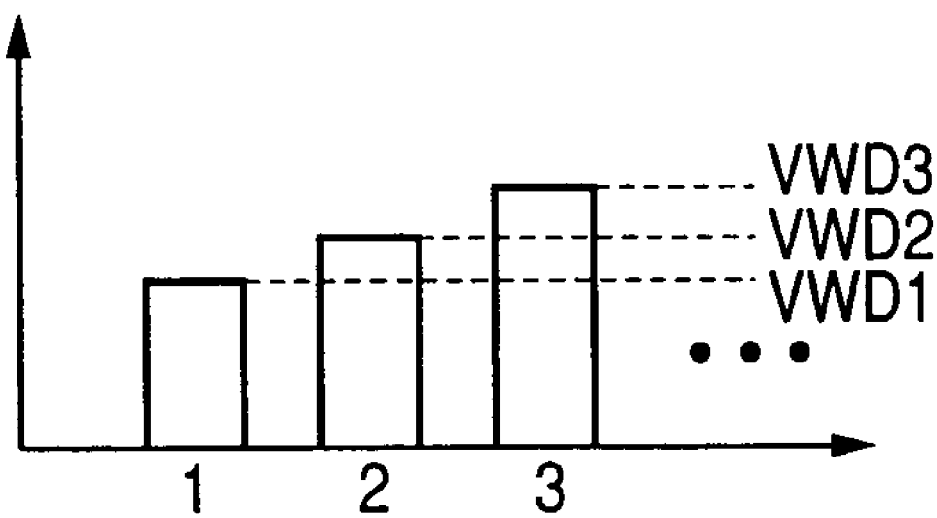
FIG. 24 is a diagram showing timings in the programming operation according to the eighth embodiment.

Further, a method shown in FIG. 24 is also effective wherein a voltage to be applied to a drain is increased (VWD1, VWD2, VW3, etc.) with the increase in programming pulse cycles. Since the efficiency of injecting electrons into a floating gate is enhanced with the increase in the drain voltage, it is possible to perform programming with the electron injection efficiency being maintained constant by properly setting VWD1, VWD2, VW3, etc. in accordance with a memory cell characteristic.

<Embodiment 9>

Figure 25:
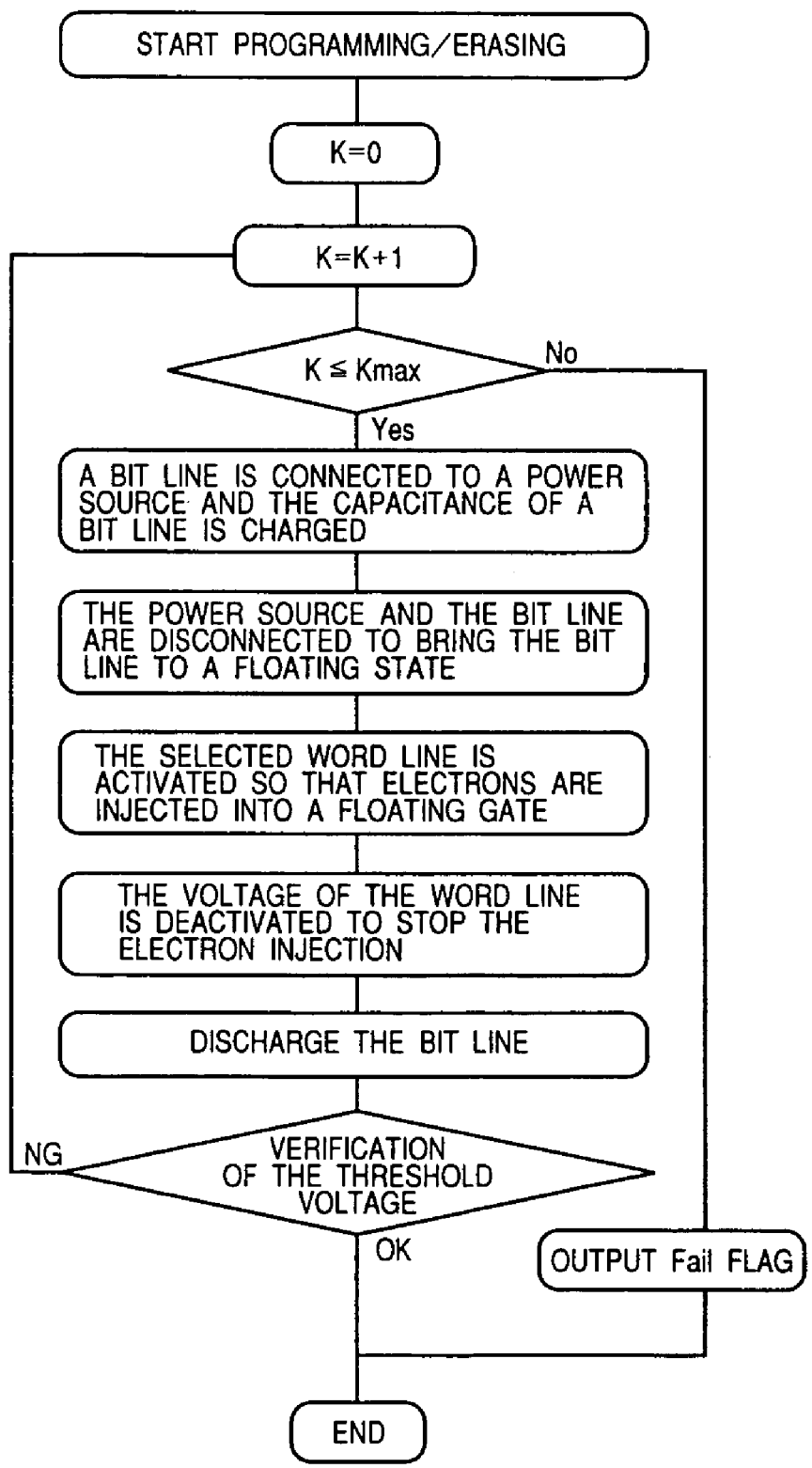
FIG. 25 is a flowchart illustrating the programming method according to the first to eighth embodiments.
Figure 26:
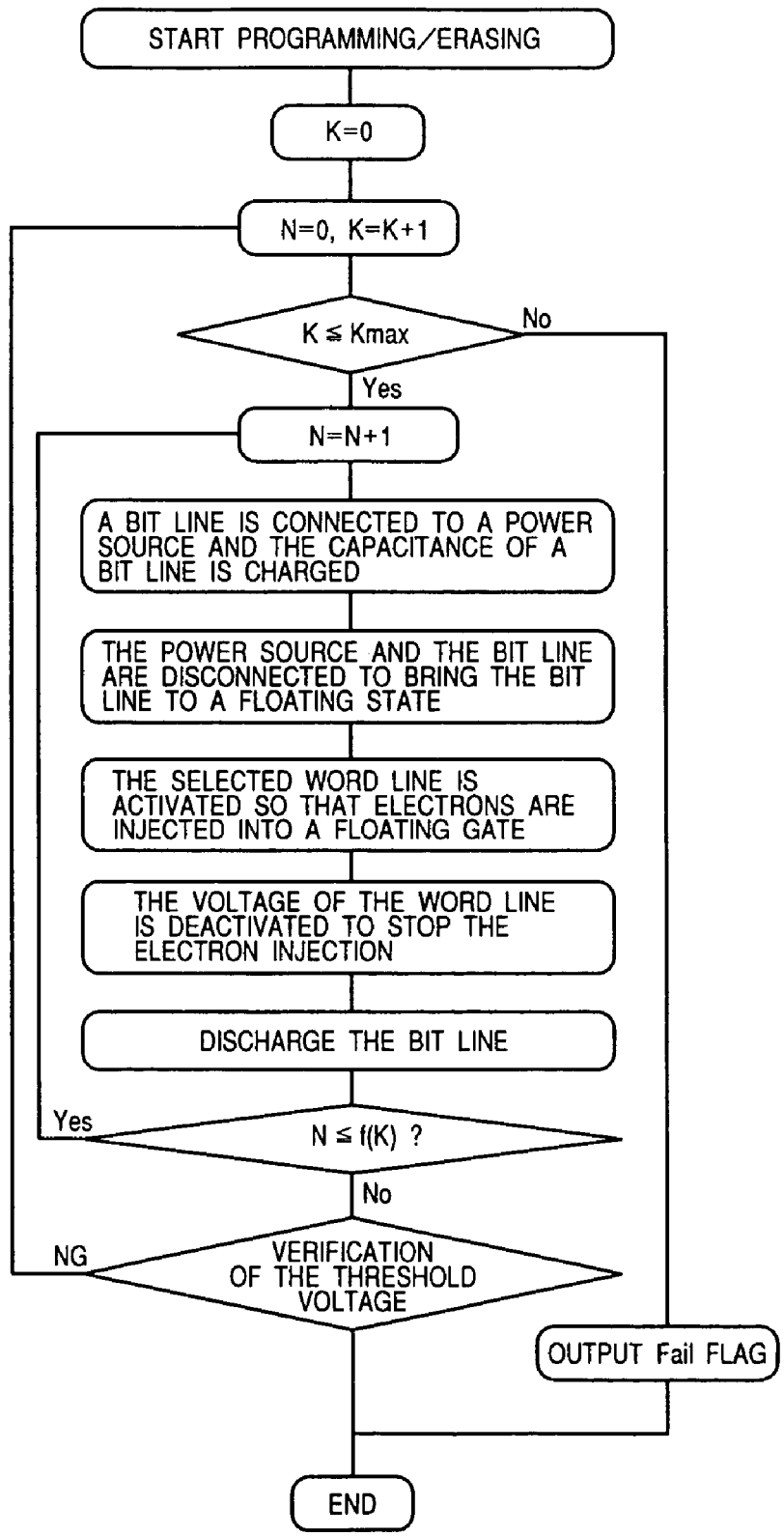
FIG. 26 is a flowchart illustrating a programming method according to a ninth embodiment of the present invention.

A ninth embodiment of the present invention will be described with reference to FIGS. 25 and 26. Embodiments 1 to 8 heretofore describe the method of performing programming by supplying an injected charge to a memory cell and the method of performing programming by charging certain capacitance via a memory cell. In both of the methods, the verification operation of a threshold voltage is performed every time an electron injection operation is performed as shown in FIG. 25. In these methods, if a change in the threshold voltage in one electron injection operation is inadequate, the number of repetition is increased to sometimes cause a reduction in programming speed. The present embodiment is characterized by preventing such reduction in programming speed by repeating the threshold voltage verification after performing the electron injection operation at least once. Shown in FIG. 26 is the programming method of the present embodiment.

The present embodiment will be described with reference to FIG. 26. After repeating the electron injection operation N=f(k) times (where k is the number of threshold voltage verification, f(k) is a function of k), the threshold voltage verification operation is repeated until programming to memory cells which are the target for programming is completed or the number of threshold voltage verification reaches a predetermined value of Kmax, thereby finishing the programming. N is a function of k, and it is possible to set a value of N to an arbitrary number in accordance with a memory cell characteristic. For example, in view of the fact that the electron injection into floating gate becomes difficult with the increase in the threshold voltage, the threshold voltage increment may be maintained as constant as possible by increasing the number of electron injection operation with the increase in the number of threshold voltage verification.

<Embodiment 10>

Figure 27:
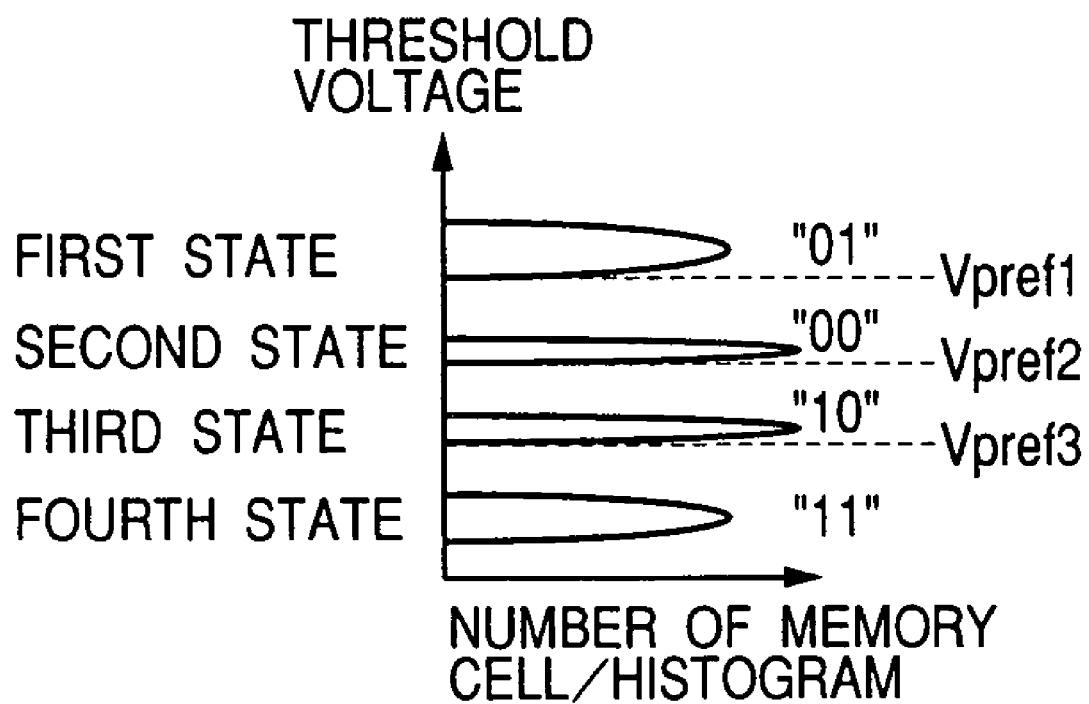
FIG. 27 is a diagram showing a threshold voltage distribution for illustrating a tenth embodiment of the present invention.

A ninth embodiment of the present invention will be described with reference to FIGS. 27 to 31. The foregoing descriptions of Embodiments 1 to 9 have been directed to the case where one memory cell has one bit of information, whereas the case of a multilevel memory wherein one memory cell has three or more threshold voltage states will be described in the present embodiment. FIG. 27 is a diagram showing a relationship between a state of threshold voltage and data in a multilevel memory of 2 bit/cell. It is possible to store 2 bits of 01, 00, 10, or 11 by setting the threshold voltage of a memory cell to a first state, a second state, a third state, or a fourth state, thereby realizing the reduction in bit cost. In FIG. 27, the fourth state corresponds to an erase state.

Figure 28:
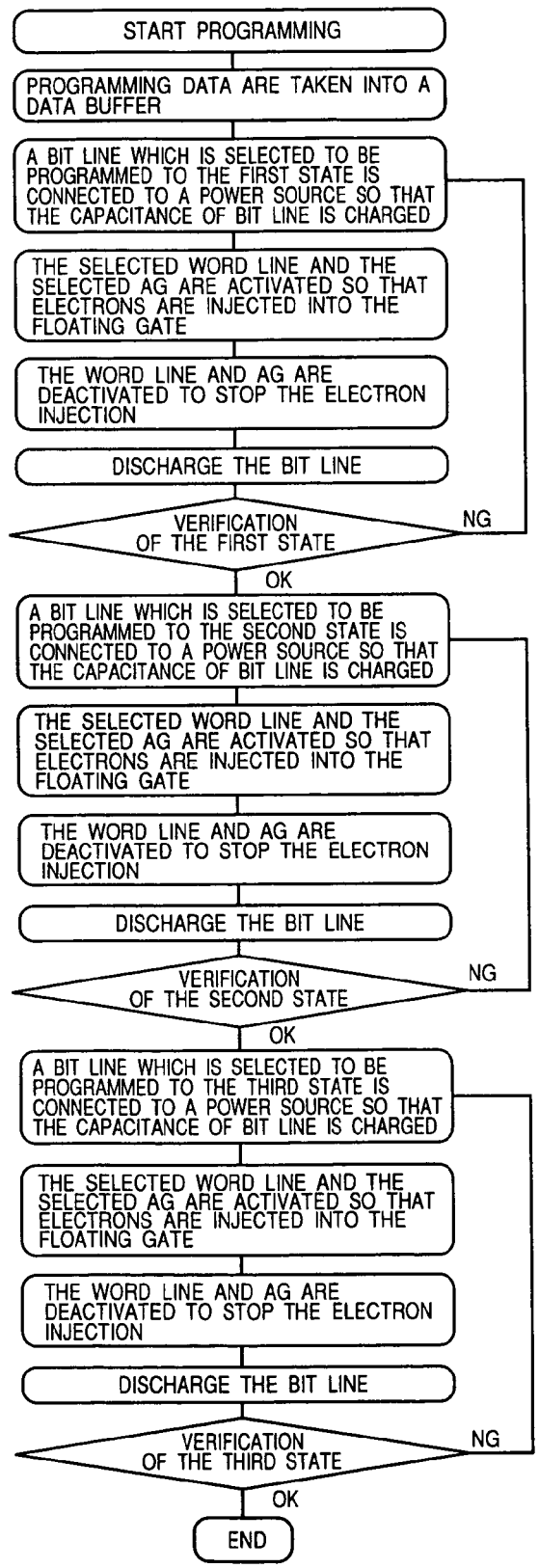
FIG. 28 is a flowchart of a conventional programming method of a multilevel flash memory.

Referring to FIGS. 27 and 28, an example of ordinary programming method in a 2 bit/self flash memory will be described. The flash memory shown in FIG. 28 can take the threshold voltage states shown in FIG. 27. When a programming command is inputted externally, programming data are taken into a data buffer of a chip. Then, a bit line associated with a memory cell on which the programming is performed at the first state is connected to a power source to be activated to about 5 V. After that, a selected word line and a selected AG are activated to about 12 V and about 0.6 V, respectively, so that part of hot electrons generated at a channel portion of the memory cell is injected into a floating gate, thereby increasing the threshold voltage of the memory cell. After the selected word line and the selected AG are inactivated and the bit line is discharged, read from the memory cell is performed. Then it is verified if the programming at the first state has been completed or not. The verification operation is performed by applying Vpref1 to the selected word line and judging whether the memory cell is brought to an ON-state. The programming operation and the verification operation are repeated until all the memory cells on which the programming is performed at the first state reach the predetermined threshold voltage.

After the completion of the programming at the first state, programming at the second state is started. A bit line associated with the memory cell on which the programming is performed at the second state is connected to the power source to be activated to about 5 V. Then, a selected word line and a selected AG are activated to about 12 V and about 0.6 V, respectively, so that part of hot electrons generated in a channel portion of the memory cell is injected into a floating gate, thereby increasing the threshold voltage of the memory cell. After the selected word line and the selected AG are inactivated and the bit line is discharged, read from the memory cell is performed and then it is verified whether or not the programming at the second state has been completed. The verification operation is performed by applying Vpref2 to the selected word line and judging whether the memory cell is brought to an ON-state. The programming operation and the verification operation are repeated until the memory cells on which the programming is performed at the second state reach the predetermined threshold voltage.

After the completion of the programming at the second state, programming at the third state is started. A bit line associated with the memory cell on which the programming is performed at the second state is connected to the power source to be activated to about 5 V. Then, a selected word line and a selected AG are activated to about 12 V and about 0.6 V, respectively, so that part of hot electrons generated in a channel portion of the memory cell is injected into a floating gate, thereby increasing a threshold voltage of the memory cell. After the selected word line and the selected AG are activated and the bit line is discharged, read from the memory cell is performed. Then it is verified whether or not the programming at the third state has been completed. The verification operation is performed by applying Vpref3 to the selected word line and judging whether or not the memory cell is brought to an ON-state. The programming operation and the verification operation are repeated until all the memory cells on which the programming is performed at the third state reach the predetermined threshold voltage.

As described above, the programming in the multilevel memory is executed by repeating the electron injection into the floating gate and the verification operation for each threshold voltage state. However, as described above, if there is the variation in the programming characteristic of the memory cell, the number of repetition (hereinafter referred to as "the number of verification") is increased. For example, if there is a variation of the order of 1.3 in the memory cell programming characteristic, about 12 times of verifications are required for each of the states, so that the number of verification for three states reaches 36 times. Thus, particularly in the multilevel memory, if there is the variation in the programming characteristic of the memory cell, the problem of the increase in the programming period with the increase in the number of verification becomes more prominent.

Figure 29:
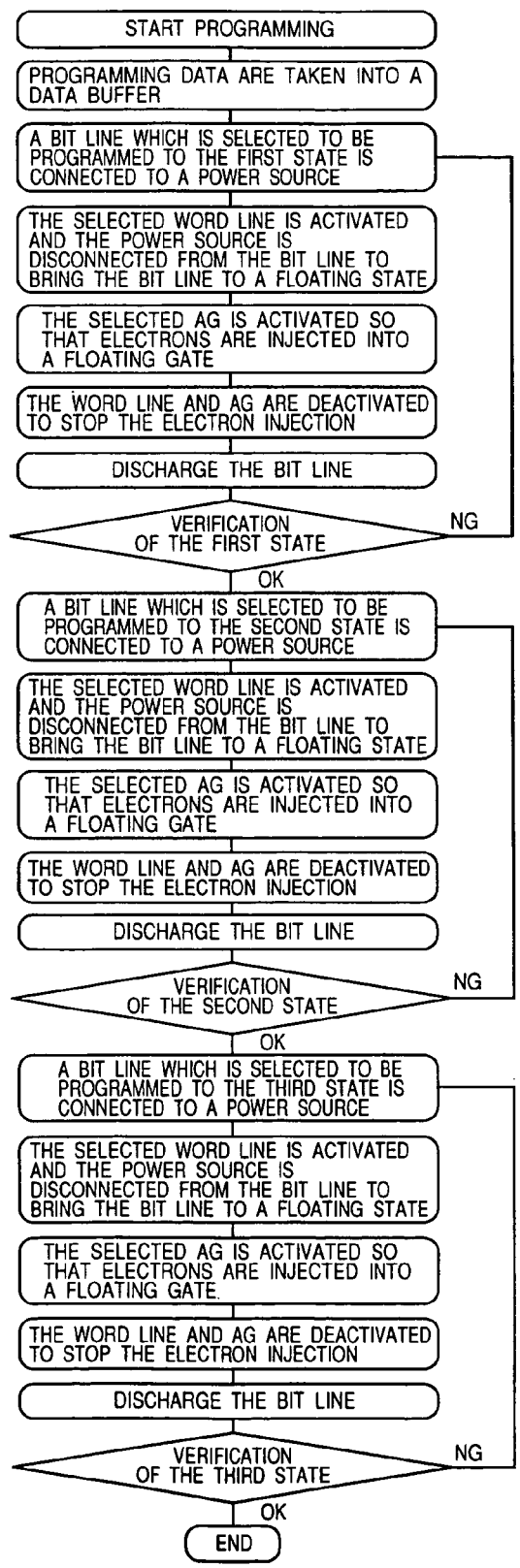
FIG. 29 is a flowchart illustrating a programming method according to the tenth embodiment of the present invention.

Shown in FIG. 29 is a flowchart of the case where the programming method of the second embodiment is applied to the 2 bit/cell. When a programming command is inputted externally, programming data are taken into a data buffer of a chip. Then, a bit line associated with a memory cell on which the programming is performed at the first state are connected to a power source to be activated to about 5 V, and a selected word line is activated to 12 V and then disconnected from the power source to come in a floating state. After that, a selected AG is activated to about 0.6 V so that a charge which has been accumulated in stray capacitance of the bit line is discharged via the memory cell and part of hot electrons generated by the discharge is injected into a floating gate, thereby increasing the threshold voltage of the memory cell. After the selected AG and the selected word line are inactivated and the bit line is discharged, read from the memory cell is performed. Then it is verified whether or not the programming at the first state has been completed. The verification operation is performed by applying Vpref1 to the selected word line and judging whether or not the memory cell is brought to an ON-state. The programming operation and the verification operation are repeated until all the memory cells on which the programming is performed at the first state reach the predetermined threshold voltage.

After the completion of the programming at the first state, programming at the second state is started. A bit line associated with a memory cell on which the programming is performed at the second state are connected to a power source to be activated to about 5 V, and a selected word line is activated to 12 V and then disconnected from the power source to come in a floating state. After that, a selected AG is activated to about 0.6 V so that a charge which has been accumulated in stray capacitance of the bit line is discharged via the memory cell and part of hot electrons generated by the discharge is injected into a floating gate, thereby increasing the threshold voltage of the memory cell. After the selected AG and the selected word line are inactivated and the bit line is discharged, read from the memory cell is performed. Then it is verified whether or not the programming at the second state has been completed. The verification operation is performed by applying Vpref2 to the selected word line and judging whether or not the memory cell is brought to an ON-state. The programming operation and the verification operation are repeated until the memory cells on which the programming is performed at the second state reach the predetermined threshold voltage.

After the completion of the programming at the second state, programming at the third state is started. A bit line associated with a memory cell on which the programming is performed at the third state are connected to a power source to be activated to about 5 V, and a selected word line is activated to 12 V and then disconnected from the power source to be in a floating state. After that, a selected AG is activated to about 0.6 V so that a charge which has been accumulated in stray capacitance of the bit line is discharged via the memory cell and part of hot electrons generated by the discharge is injected into a floating gate, thereby increasing the threshold voltage of the memory cell. After the selected AG and the selected word line are inactivated and the bit line is discharged, read from the memory cell is performed. Then it is verified whether or not the programming at the third state has been completed. The verification operation is performed by applying Vpref3 to the selected word line and judging whether or not the memory cell is brought to an ON-state. The programming operation and the verification operation are repeated until the memory cells on which the programming is performed at the third state reach the predetermined threshold voltage.

As described above, it is possible to suppress the programming characteristic variation to the order of about 0.3 as a result of performing the programming by supplying the charge which has been accumulated in the stray capacitance of the bit line, i.e. the charge accumulated in the certain capacitance, to the memory cell. In this case, the number of verification is reduced to 3 times for each state, and the number of verification for the three states is less than 10 times. Thus, the problem associated with the multilevel flash memory, i.e., the reduction in the programming speed, can be suppressed.

Figure 30:
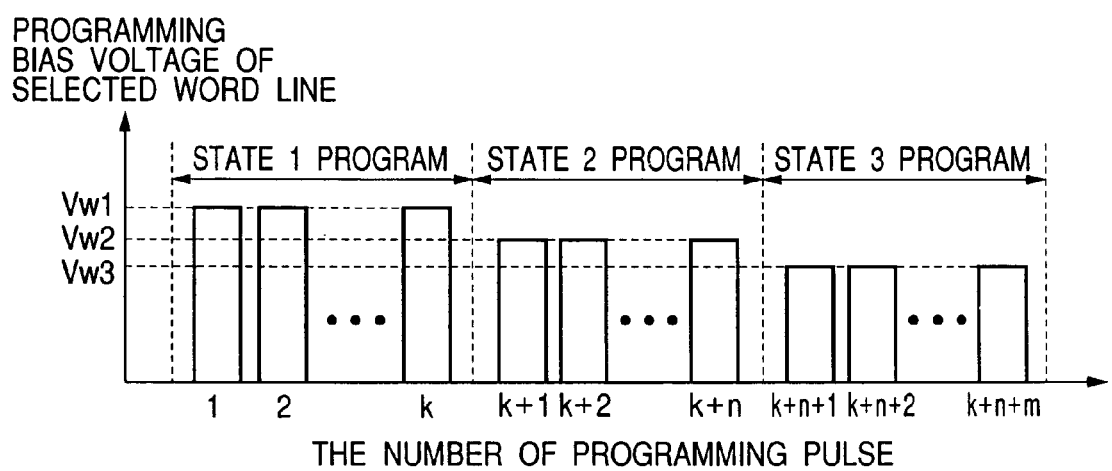
FIG. 30 is a diagram illustrating timings according to the tenth embodiment of the present invention.

In the foregoing description, the voltages applied to the memory cell at the first to third states are the same; however, the voltages may be set as shown in FIG. 30 wherein the selected word line voltage Vw1 at the first state programming is higher than the selected word line voltage Vw2 at the second state programming and VW2 is higher than the selected word line voltage Vw3 at the third state programming. In this case, more efficient programming is achieved since a higher voltage is applied to the memory cell in which the threshold voltage must be changed greatly.

Figure 31:
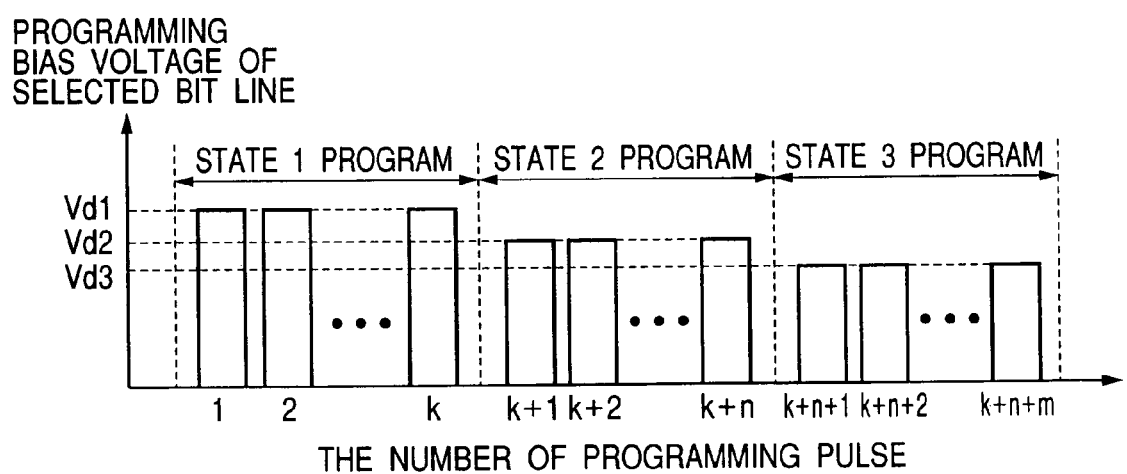
FIG. 31 is a diagram illustrating timings according to the tenth embodiment of the present invention.

Further, the voltages may be set as shown in FIG. 31 wherein the selected word line voltage Vd1 at the first state programming is higher than the selected word line voltage Vd2 at the second state programming and Vd2 is higher than the selected word line voltage Vd3 at the third state programming. In this case, more efficient programming is achieved since a higher voltage is applied to the memory cell in which the threshold voltage must be changed greatly.

Although the case of applying the programming method of the second embodiment to the 2-bit/cell nonvolatile memory has been described in the foregoing, it is possible to apply the programming method to a multilevel memory having 3 bits or more per cell, as well. Further, it is needless to say that the methods described in the first and third to sixth embodiments can also be applied to a multilevel memory having 2 bits or more per cell.

<Embodiment 11>

Figure 32:
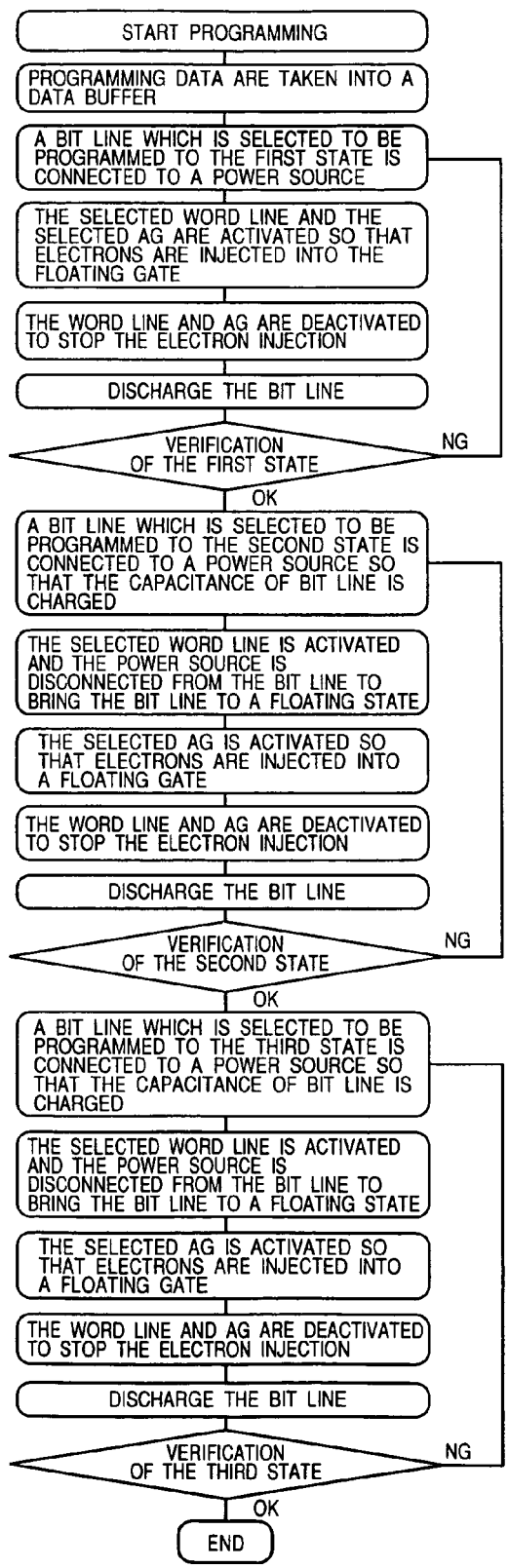
FIG. 32 is a flowchart illustrating a programming method according to an eleventh embodiment of the present invention.

Shown in FIG. 32 is a multilevel programming method different from that of the ninth embodiment. In general, in the array structure shown in FIG. 6, the upper limit of the threshold voltage of a memory cell is determined only by reliability. Accordingly, a distribution width of the first state shown in FIG. 27 can greatly be set to higher threshold voltages. Therefore, in the programming at the first state, it is unnecessary to control the threshold voltage highly precisely, and it is possible to complete the programming by the application of one pulse irrespective of the characteristic variation by increasing the programming pulse width or the voltage.

In the first state programming, a bit line associated with a memory cell on which the programming is performed at the first state is connected to a power source to be activated to about 5 V and, after that, a selected word line and a selected AG are activated to about 12 V and about 0.6 V, respectively, so that part of hot electrons generated at a channel portion of the memory cell is injected into a floating gate. Here, if a pulse width of the high voltage which is applied to the selected word line is set to 10 μs or more or the selected word line voltage is set to a sufficiently high level such as about 15 V, it is possible to complete the programming at the first state by one programming pulse.

After the completion of the first state programming, second state programming is started. The flow subsequent to the second state programming is the same as that of the second embodiment, that is, only the charge accumulated in the stray capacitance of the bit line is supplied to the memory cell to execute the programming. A bit line associated with a memory cell on which the programming is performed at the second state is connected to a power source to be activated to about 5 V, and a selected word line is activated to about 12 V and then disconnected from the power source to come in a floating state. After that, a selected AG is activated to about 0.6 V so that a charge which has been accumulated in stray capacitance of the bit line is discharged via the memory cell and part of hot electrons generated by the discharge is injected into a floating gate, thereby increasing the threshold voltage of the memory cell. After the selected AG and the selected word line are inactivated and the bit line is discharged, read from the memory cell is performed. Then it is verified whether or not the programming at the second state has been completed. The verification operation is performed by applying Vpref2 to the selected word line and judging whether or not the memory cell is brought to an ON-state. The programming operation and the verification operation are repeated until the memory cells on which the programming is performed at the second state reach the predetermined threshold voltage.

After the completion of the second state programming, a third state programming is started. A bit line associated with a memory cell on which the programming is performed at the third state is connected to a power source to be activated to about 5 V, and a selected word line is activated to about 12 V and then disconnected from the power source to come in a floating state. After that, a selected AG is activated to about 0.6 V so that a charge which has been accumulated in stray capacitance of the bit line is discharged via the memory cell and part of hot electrons generated by the discharge is injected into a floating gate, thereby increasing the threshold voltage of the memory cell. After the selected AG and the selected word line are inactivated and the bit line is discharged, read from the memory cell is performed. Then it is verified whether or not the programming at the third state has been completed. The verification operation is performed by applying Vpref3 to the selected word line and judging whether or not the memory cell is brought to an ON-state. The programming operation and the verification operation are repeated until all the memory cells on which the programming is performed at the third state reach the predetermined threshold voltage.

It is possible to reduce the number of verification to about 7 times by establishing a state equivalent to the maximum threshold voltage distribution by one programming pulse as described in the present embodiment.

Although the case of applying the programming method of the second embodiment to the 2-bit/cell nonvolatile memory has been described in the foregoing, it is possible to apply the programming method to a multilevel memory having 3 bits or more per cell, as well. Further, it is needless to say that the methods described in the first and third to sixth embodiments can also be applied to a multilevel memory of 2 bits or more per cell.

<Embodiment 12>

Figure 33:
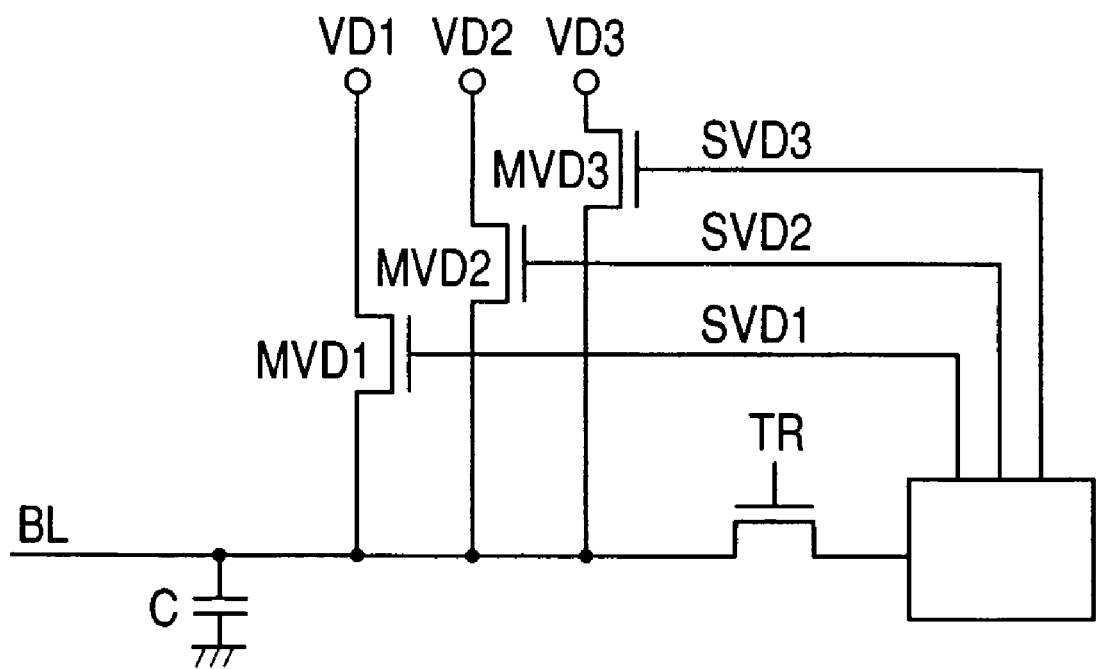
FIG. 33 is a circuit diagram illustrating a twelfth embodiment of the present invention.

Shown in FIG. 33 is a multilevel programming method different from that of Embodiments 10 and 11. Referring to FIG. 33, reference numeral 70 denotes a read and program control circuit, in which, in the case of programming at the first state, a MOS transistor MVD1 is brought to an ON-state by activating SVD1 to connect a first power source VD1 to a bit line BL. Likewise, SVD2 is activated to connect a second power source VD2 to the bit line BL in the case of programming at the second state, and SVD3 is activated to connect a third power source VD3 to the bit line BL in the case of programming at the third state. Here, the first power source has a voltage higher than that of the second power source, and the second power source has a voltage higher than that of the third power source. For example, the voltages of the first, second, and third power sources are 6 V, 5 V, and 4 V, respectively.

Figure 34:
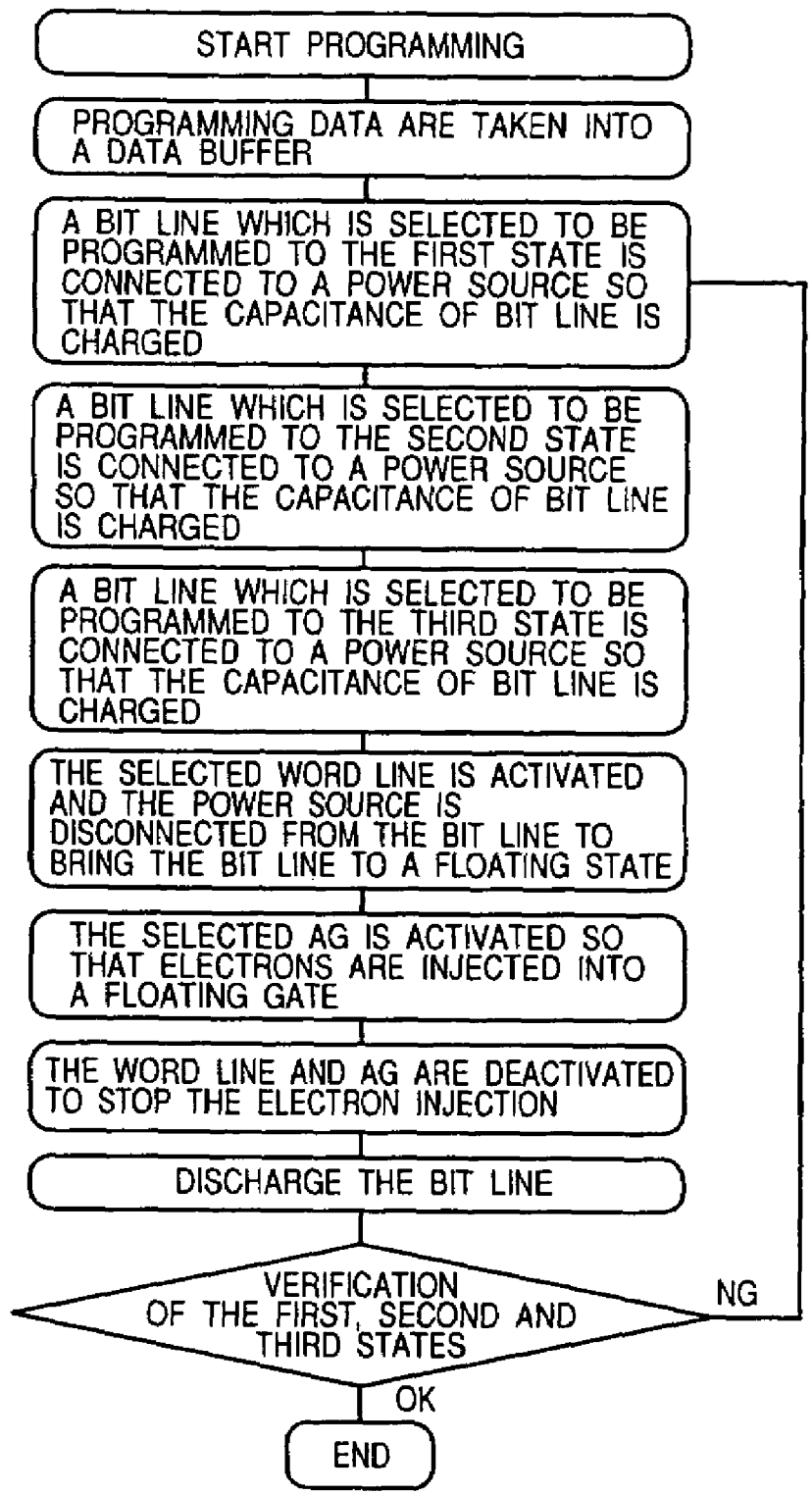
FIG. 34 is a flowchart illustrating a programming method according to the twelfth embodiment of the present invention.

Shown in FIG. 34 is a programming flow in the circuit structure of FIG. 33. When a programming command and programming data are inputted, the bit line is connected to the power source associated with the programming data so as to be charged to a desired voltage. For example, the bit line of a memory cell which is selected for the programming at the first state is charged to 6 V; the bit line of a memory cell which is selected for the programming at the second state is charged to 5 V; and the bit line which is selected for the programming at the third state is charged to 4 V. After that, the connections between the bit lines and the power sources are interrupted to bring the bit lines to a floating state. A selected word line is then activated to about 12 V, which is a programming voltage, and a selected AG is activated to about 0.6 V, so that charges which have been charged in the bit lines is discharged via the memory cells and hot electrons generated by the discharge are injected into floating gates. Here, the memory cells which must be set to the higher threshold voltage have a larger quantity of bit line-accumulated charges and a larger quantity of injection charges into the floating gates. After the selected AG and the selected word line are inactivated and the bit lines is discharged, read from the memory cell is performed. Then it is verified whether or not the programming at the first to third states have been completed. The programming operation and the verification operation are repeated until the memory cells on which the programmings at the first to third states are performed reach the predetermined threshold voltages. It is thus possible to complete the programming at the three states substantially simultaneously by properly setting the first to third power source voltages.

In the present embodiment, since the programming and the verification at the three states are performed simultaneously, the number of required verification is about 3 times.

<Embodiment 13>

Figure 35:
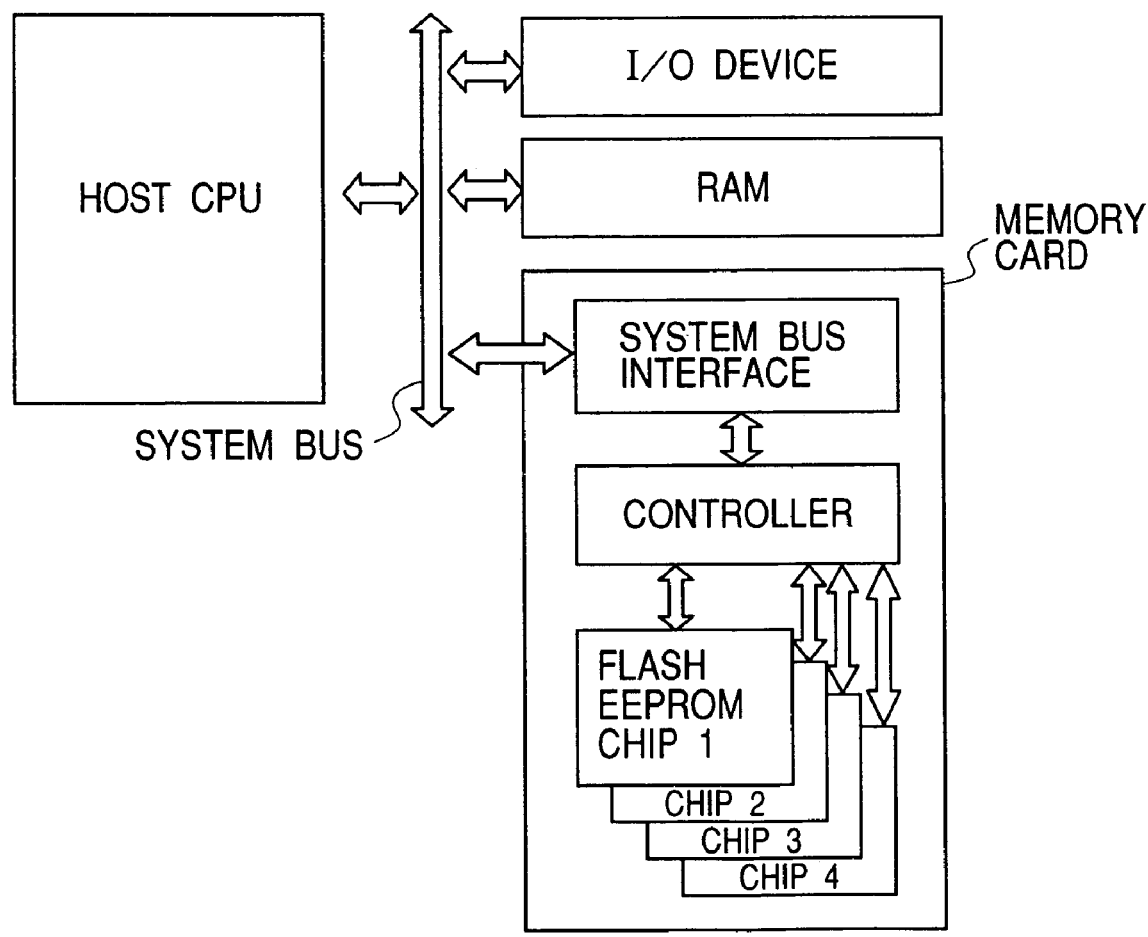
FIG. 35 is a block diagram showing a system according to a thirteenth embodiment of the present invention.

Shown in FIG. 35 is a computer system wherein the flash nonvolatile memory according to one of Embodiments 1 to 12 is incorporated, the system having a host CPU mutually connected to the system via a system bus, an input/output device, a RAM, and a memory card.

The memory card includes the flash nonvolatile memory having a large memory capacity of a several tens of gigabytes, which is used for substituting for a hard disk storage device, for example. Since the memory card has the benefit of the high programming speed which is the advantage of the flash nonvolatile memory according to the embodiments of the present invention, it has a sufficient industrial advantage as a memory device which is an end product.

The memory card of the present invention is not limited to a relatively thin memory card. It is needless to say that a memory card which is relatively larger in thickness is applicable to any nonvolatile memory devices having an interface for a host bus system and an intelligent controller capable of controlling the flash nonvolatile memory by analyzing a command from the host system.

Data to be stored for a long period of time are stored in the nonvolatile memory device, while data to be altered frequently as being processed by the host CPU are stored in the RAM of the nonvolatile memory.

The card has a system bus interface to be connected to the system bus to realize a standard bus interface such as an ATA system bus. A controller connected to the system bus interface receives commands and data from a host connected to the system bus as well as host systems of the CPU and the input/output device.

If the command is a read command, the controller accesses one or more of flash EEPROMs to transfer read data to the host system.

If the command is a write command, the controller accesses one or more of the flash EEPROMs to store internally the write data sent from the host system. The storage operation includes programming operations and verification operations for relevant blocks, sectors, and memory cells of the flash memory.

If the command is an erase command, the controller accesses to one or more of the flash EEPROMs to erase data stored in the accessed flash EEPROM. The erase operation includes erase operations and verification operations for relevant blocks, sectors, and memory cells of the flash memory.

It is needless to say that the flash nonvolatile memory according to the embodiments of the present invention is applicable not only to a technology for setting two threshold voltages in one memory cell in order to store 1 bit of digital data in one memory cell but also to a technology for setting four or more threshold voltages in one memory cell in order to store a plurality of bits of digital data in one memory cell.

While the foregoing embodiments are used for describing the invention produced by the present inventors, it is apparent that the invention is not limited to the embodiments and the invention can be modified as long as the modification does not depart from the spirit and scope of the invention.

For example, the present invention is applicable to a one-chip microcomputer (semiconductor device) which is provided with a memory cell array unit having a nonvolatile semiconductor memory element.

According to the present invention, the programming speed or the erasing speed of the nonvolatile semiconductor memory device is improved and a power consumption of the nonvolatile semiconductor memory device is reduced.

What we claim is:

1. A nonvolatile semiconductor memory device comprising:
   a memory cell including first and second diffusion layers, a charge-storage portion between the first and second diffusion layers, a gate between the charge-storage portion and the first diffusion layer, and a word line formed above the charge storage portion and controlled separately from the gate; and
   a bit line connected to the memory cell;
   wherein the charge storage portion is injected with hot electrons which are generated by passing charges accumulated in stray capacitance of the bit line through the memory cell at a portion in a semiconductor substrate under a boundary between the charge-storage portion and the gate when the memory cell is programmed or erased.

2. A nonvolatile semiconductor memory device according to claim 1,
   wherein the charge storage portion is a floating gate.

3. A nonvolatile semiconductor memory device according to claim 1,
   wherein the charge storage portion is a silicon nitride film.

4. A nonvolatile semiconductor memory device according to claim 1,
   wherein a portion of the stray capacitance is formed of p-n junction capacitance of a diffusion layer of the memory cell.

5. A nonvolatile semiconductor memory device according to claim 1, further comprising:
   an internal power source circuit to generate a voltage to be applied to the bit line,
   wherein, when the memory cell is programmed or erased, the internal power source circuit is brought to an inactive state.

6. A nonvolatile semiconductor memory device according to claim 1,
   wherein, after the programming or the erase is performed a plurality of times, an operation of verifying a threshold voltage of the memory cell is performed.

7. A nonvolatile semiconductor memory device according to claim 6,
   wherein the number of repeating the programming or the erase is incremented every time the threshold voltage verification operation is performed.

8. A nonvolatile semiconductor memory device comprising:
   a memory cell including first and second diffusion layers, a charge-storage portion between the first and second diffusion layers, a gate between the charge-storage portion and the first diffusion layer, and a word line formed above the charge-storage portion and controlled separately from the gate; and
   a bit line connected to the memory cell;
   means for injecting hot electrons into the charge-storage portion of the memory cell, which hot electrons are generated by passing charges accumulated in stray capacitance of the bit line through the memory cell at a portion in a semiconductor substrate under a boundary between the charge-storage portion and the gate, when the memory cell is programmed or erased.

9. A nonvolatile semiconductor memory device according to claim 8,
wherein the charge-storage portion is a floating gate.

10. A nonvolatile semiconductor memory device according to claim 8,
wherein the charge-storage portion is a silicon nitride film.

11. A nonvolatile semiconductor memory device according to claim 8,
wherein a portion of the stray capacitance is formed of p-n junction capacitance of a diffusion layer of the memory cell.

12. A nonvolatile semiconductor memory device according to claim 8, further comprising:
an internal power source circuit to generate a voltage to be applied to the bit line,
wherein, when the memory cell is programmed or erased, the internal power source circuit is brought to an inactive state.

13. A nonvolatile semiconductor memory device according to claim 8,
wherein, after the programming or the erase is performed a plurality of times, an operation of verifying a threshold voltage of the memory cell is performed.

14. A nonvolatile semiconductor memory device according to claim 13,
wherein the number of repeating the programming or the erase is incremented every time the threshold voltage verification operation is performed.

* * * * *

UNITED STATES PATENT AND TRADEMARK OFFICE
CERTIFICATE OF CORRECTION

PATENT NO.       : 7,283,400 B2                                    Page 1 of 1
APPLICATION NO.  : 11/228389
DATED            : October 16, 2007
INVENTOR(S)      : H. Kurata et al.

It is certified that error appears in the above-identified patent and that said Letters Patent is hereby corrected as shown below:

Title Page Insert

(30)    Foreign Application Priority Data

Jan. 12, 2001    (WO) ....................PCT/JP01/00133

Signed and Sealed this

Third Day of June, 2008

JON W. DUDAS
*Director of the United States Patent and Trademark Office*